(12) United States Patent
Ogawa et al.

(10) Patent No.: US 9,437,598 B2
(45) Date of Patent: Sep. 6, 2016

(54) SEMICONDUCTOR DEVICE MANUFACTURING METHOD AND SEMICONDUCTOR DEVICE

(71) Applicant: FUJITSU SEMICONDUCTOR LIMITED, Yokohama-shi, Kanagawa (JP)

(72) Inventors: Hiroyuki Ogawa, Nagoya (JP); Junichi Ariyoshi, Mie (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/528,241

(22) Filed: Oct. 30, 2014

(65) Prior Publication Data

US 2015/0123187 A1   May 7, 2015

(30) Foreign Application Priority Data

Nov. 7, 2013 (JP) .................. 2013-231163

(51) Int. Cl.

| H01L 27/115 | (2006.01) |
|---|---|
| H01L 29/66 | (2006.01) |
| H01L 21/8234 | (2006.01) |
| H01L 29/788 | (2006.01) |
| H01L 27/11 | (2006.01) |

(52) U.S. Cl.
CPC . *H01L 27/11521* (2013.01); *H01L 21/823493* (2013.01); *H01L 27/1104* (2013.01); *H01L 27/1116* (2013.01); *H01L 27/11531* (2013.01); *H01L 29/66825* (2013.01); *H01L 29/7881* (2013.01)

(58) Field of Classification Search
CPC ............. H01L 27/11521; H01L 21/823493; H01L 27/1104; H01L 27/1116; H01L 27/11531; H01L 29/66825; H01L 29/7881
USPC ......................................... 257/316
See application file for complete search history.

(56) References Cited

U.S. PATENT DOCUMENTS

| 6,066,522 A | 5/2000 | Hirase | |
|---|---|---|---|
| 2009/0080257 A1* | 3/2009 | Oka | G11C 5/025 365/185.13 |
| 2014/0210002 A1* | 7/2014 | Sawase | H01L 29/7825 257/334 |

FOREIGN PATENT DOCUMENTS

| JP | 5-267606 A | 10/1993 |
|---|---|---|
| JP | 10-135351 A | 5/1998 |

* cited by examiner

*Primary Examiner* — Fernando L Toledo
*Assistant Examiner* — Adam S Bowen
(74) *Attorney, Agent, or Firm* — Westerman, Hattori, Daniels & Adrian, LLP

(57) ABSTRACT

A semiconductor device manufacturing method includes: forming a first well of the first conductivity type in a substrate; forming a second well of the first conductivity type in a first region of the substrate; forming a third well of the second conductivity type underneath the second well in the first region of the substrate in a position overlapping with the first well located underneath the second well in the first region of the substrate; forming a fourth well, that surrounds the second well and has the second conductivity type, in the first region of the substrate; forming a fifth well of the first conductivity type above the first well in the second region of the substrate; and forming a sixth well of the second conductivity type above the first well in the second region of the substrate.

11 Claims, 32 Drawing Sheets

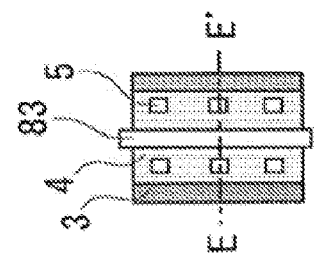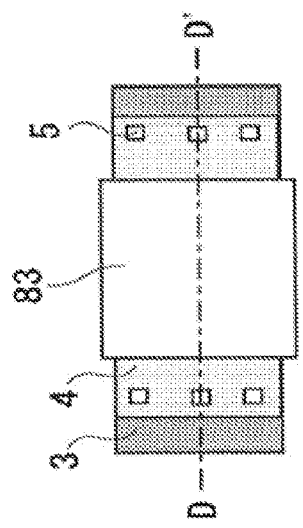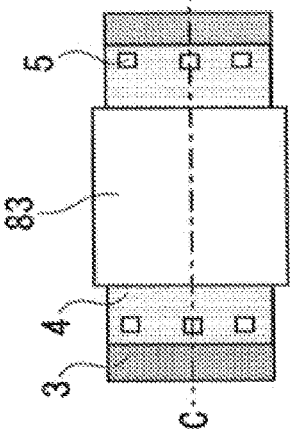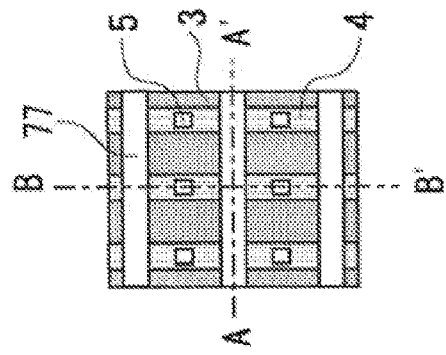

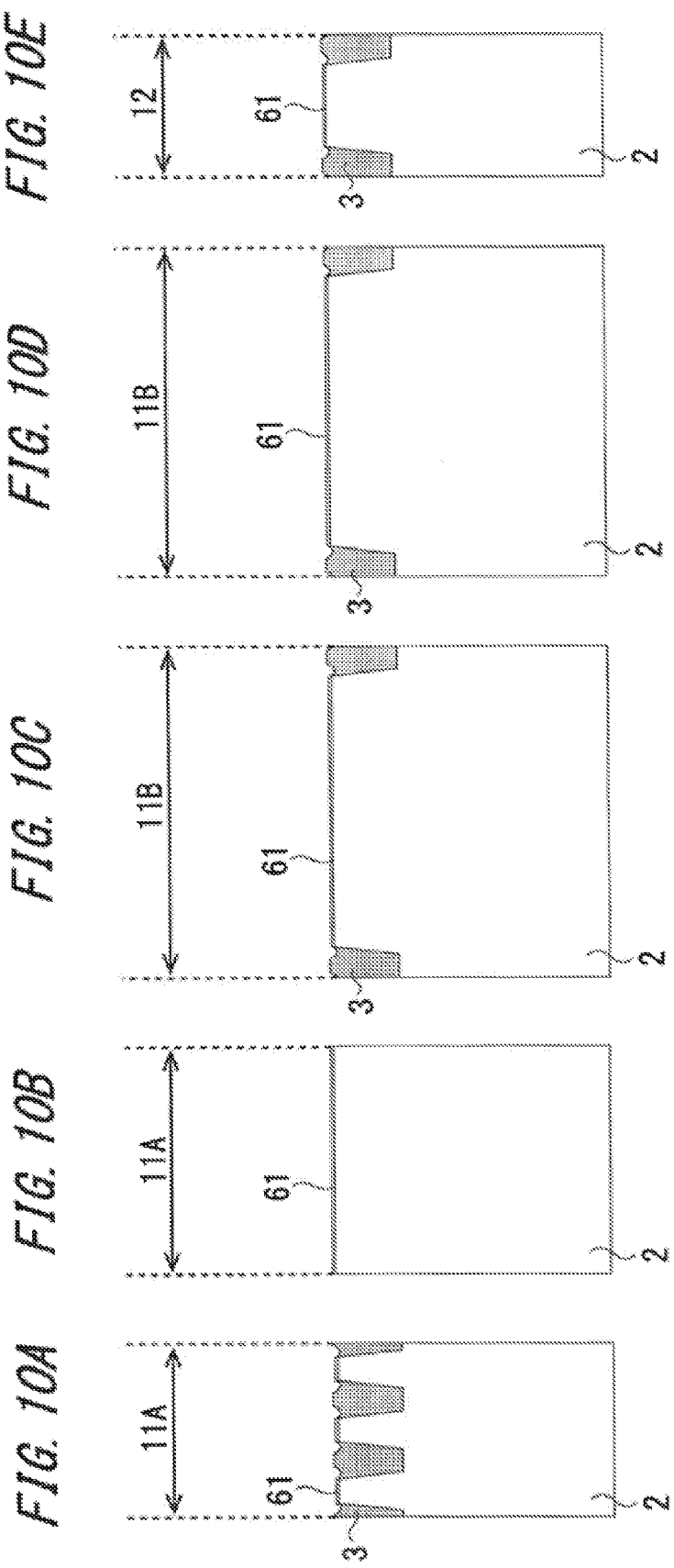

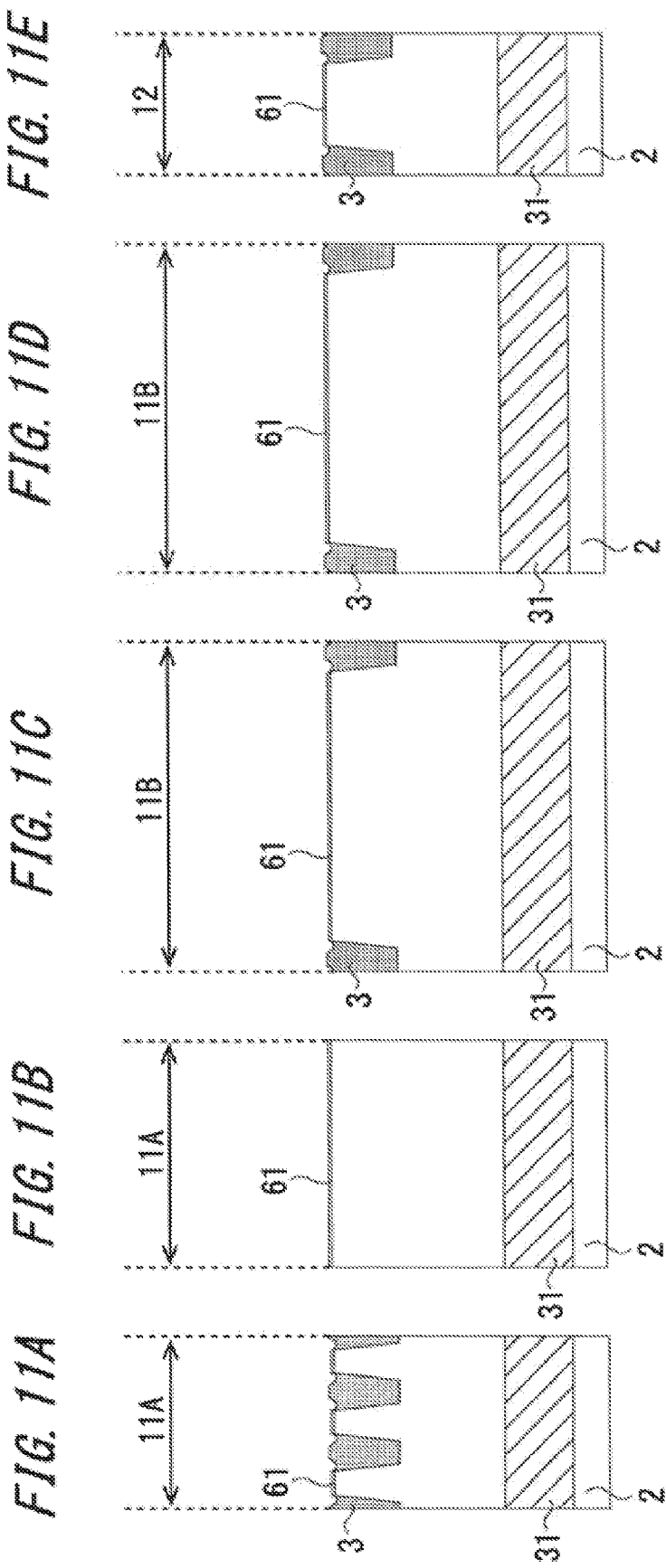

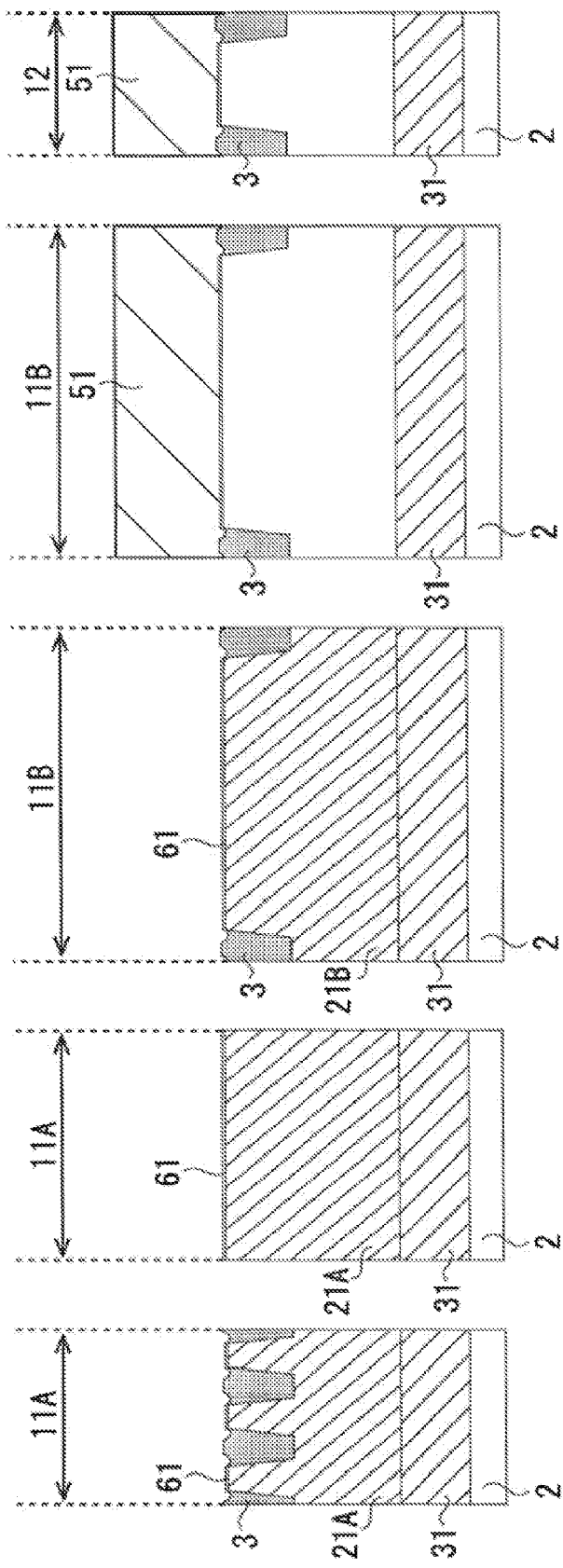

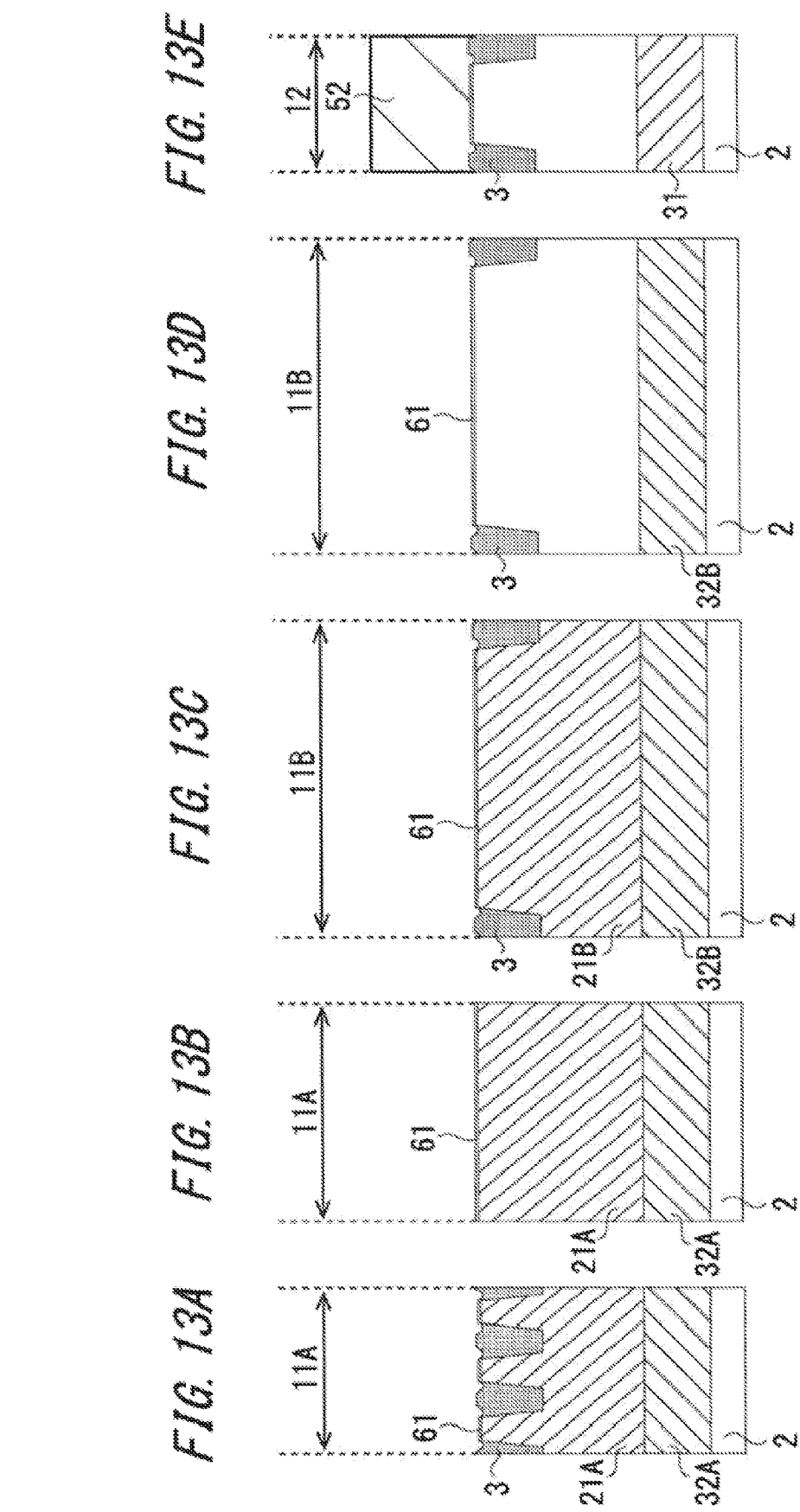

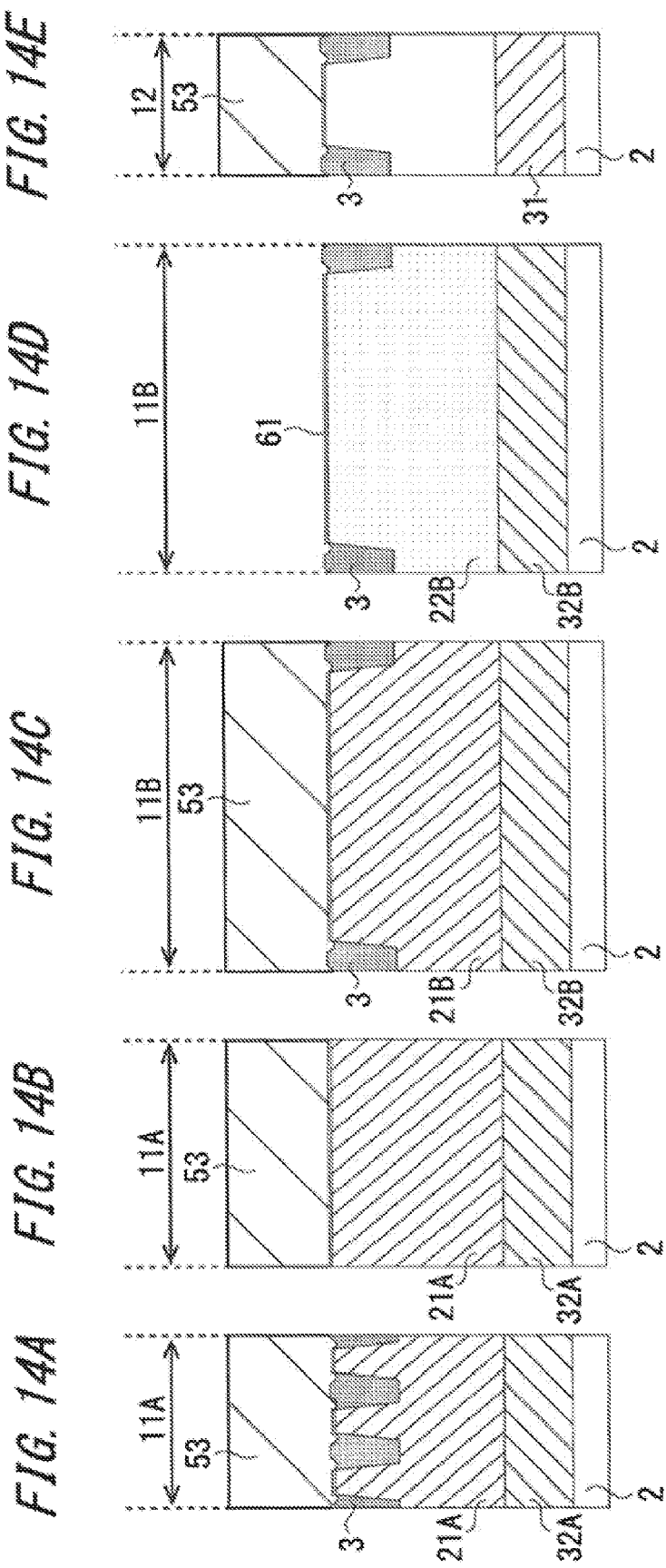

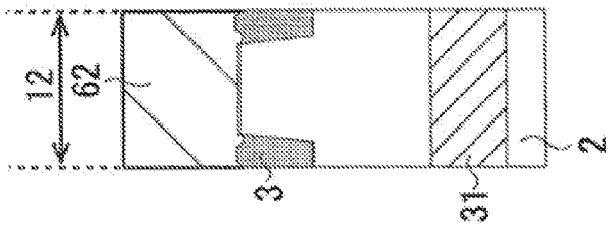
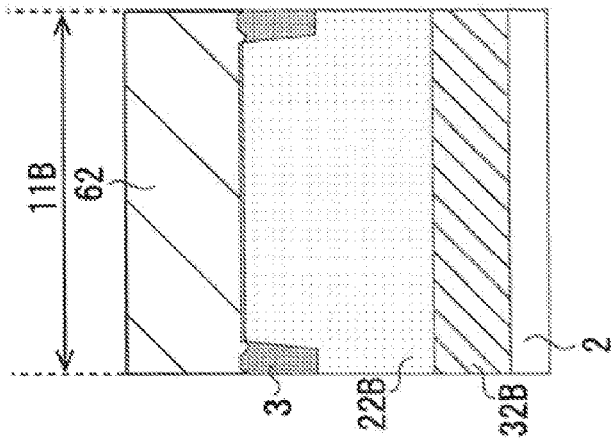
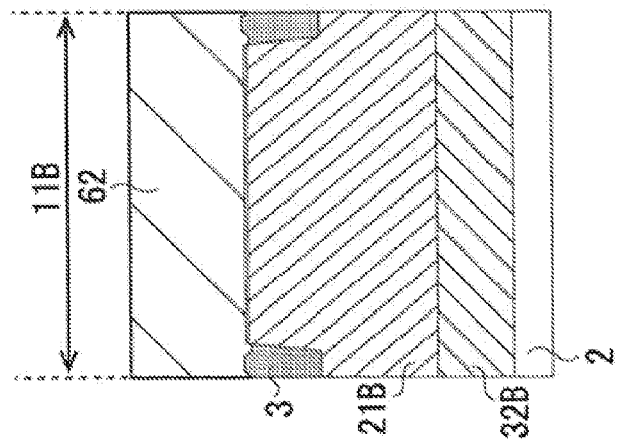
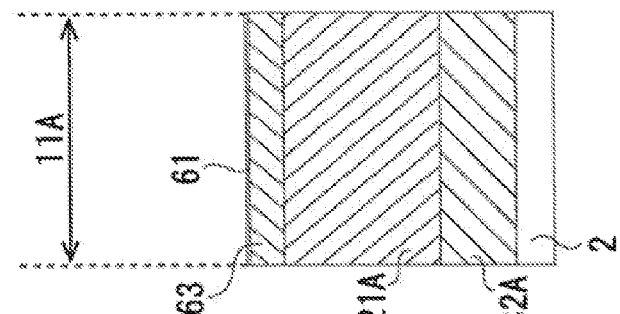
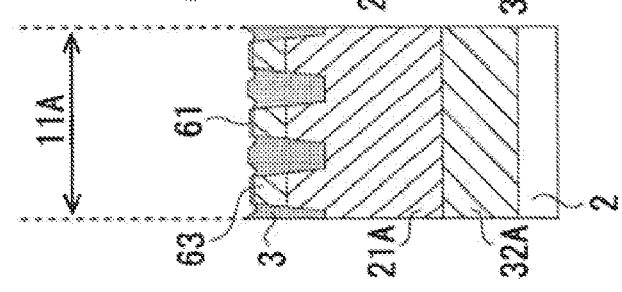

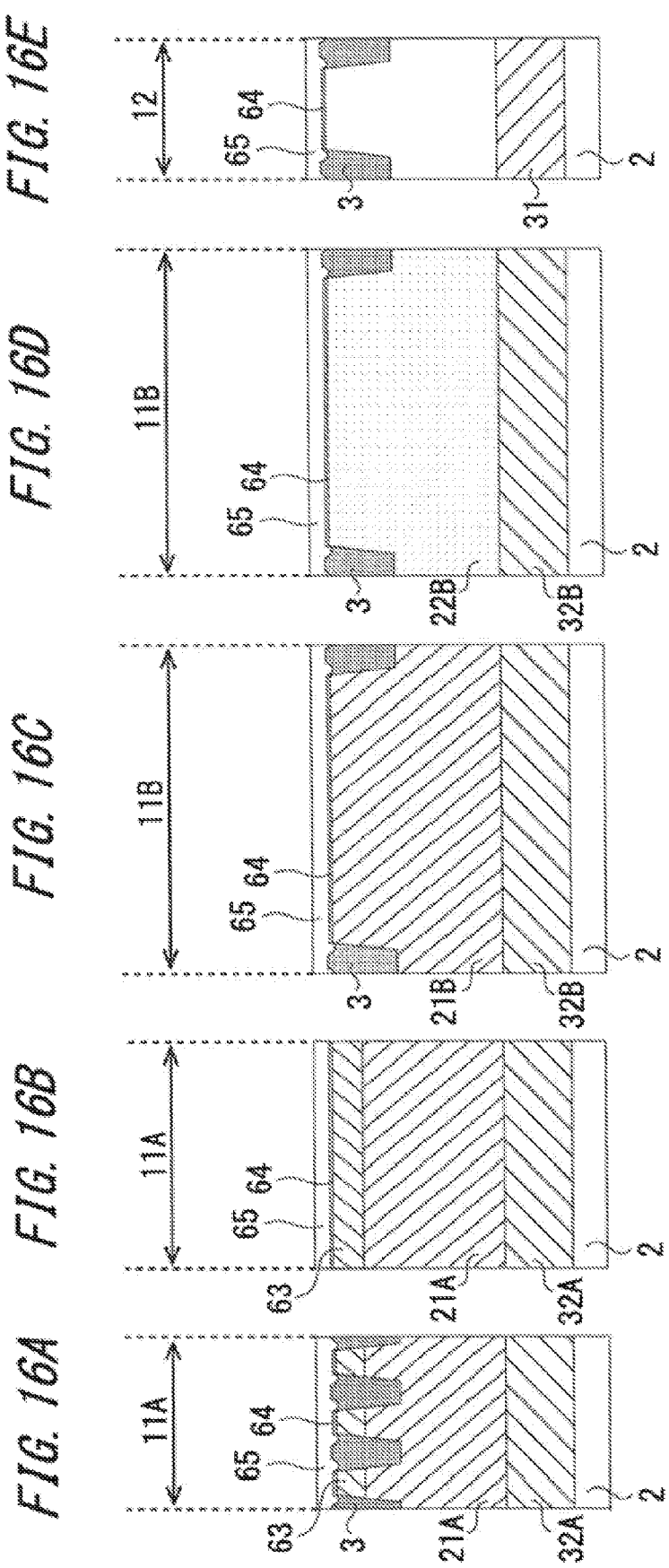

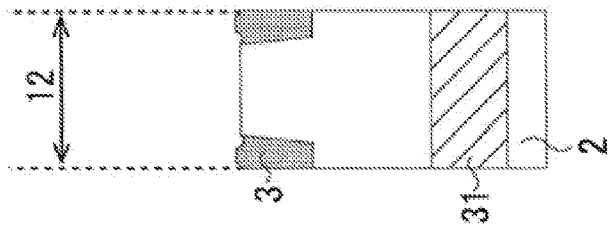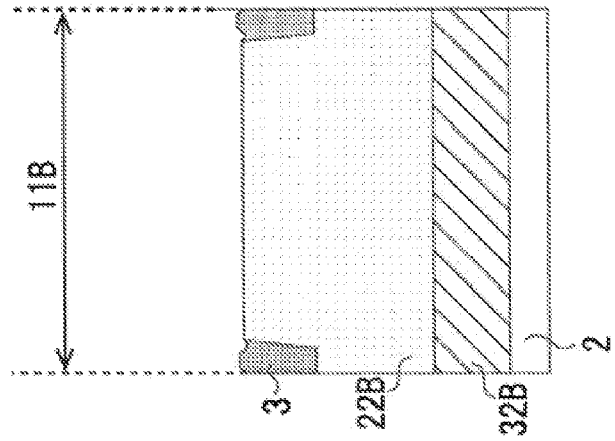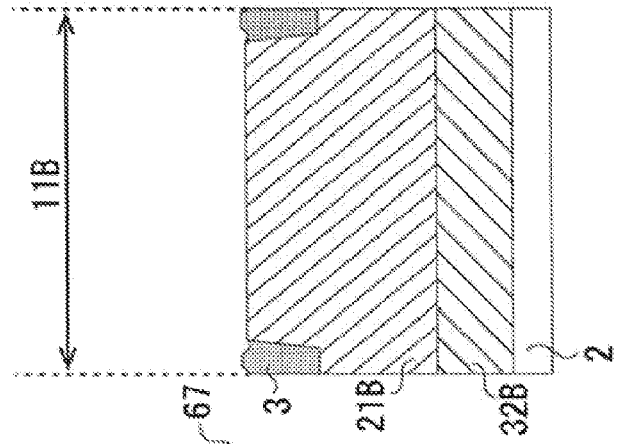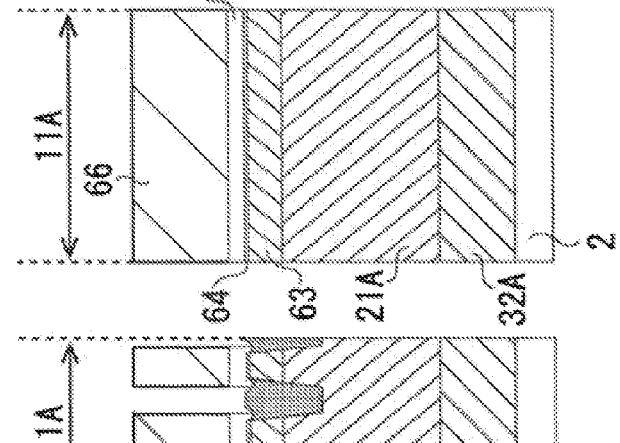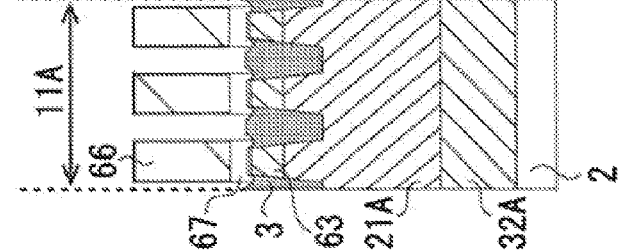

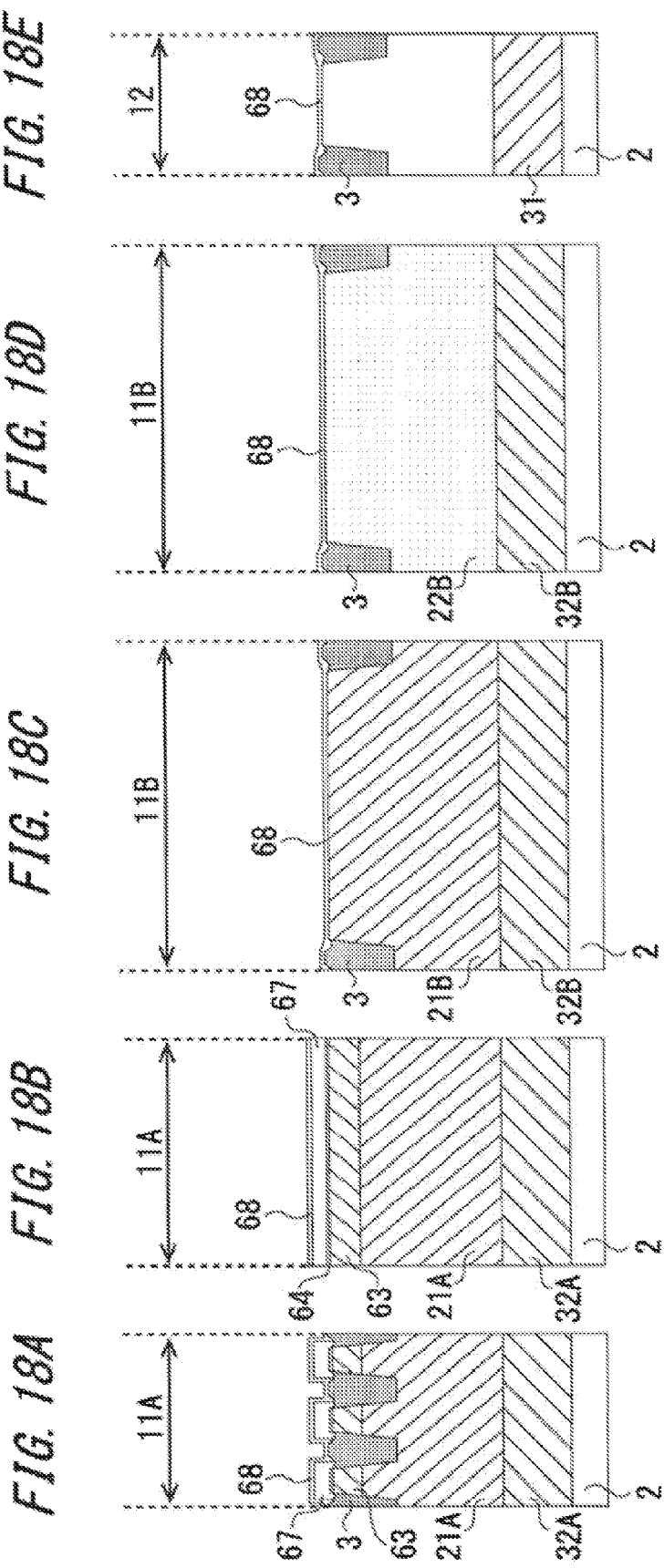

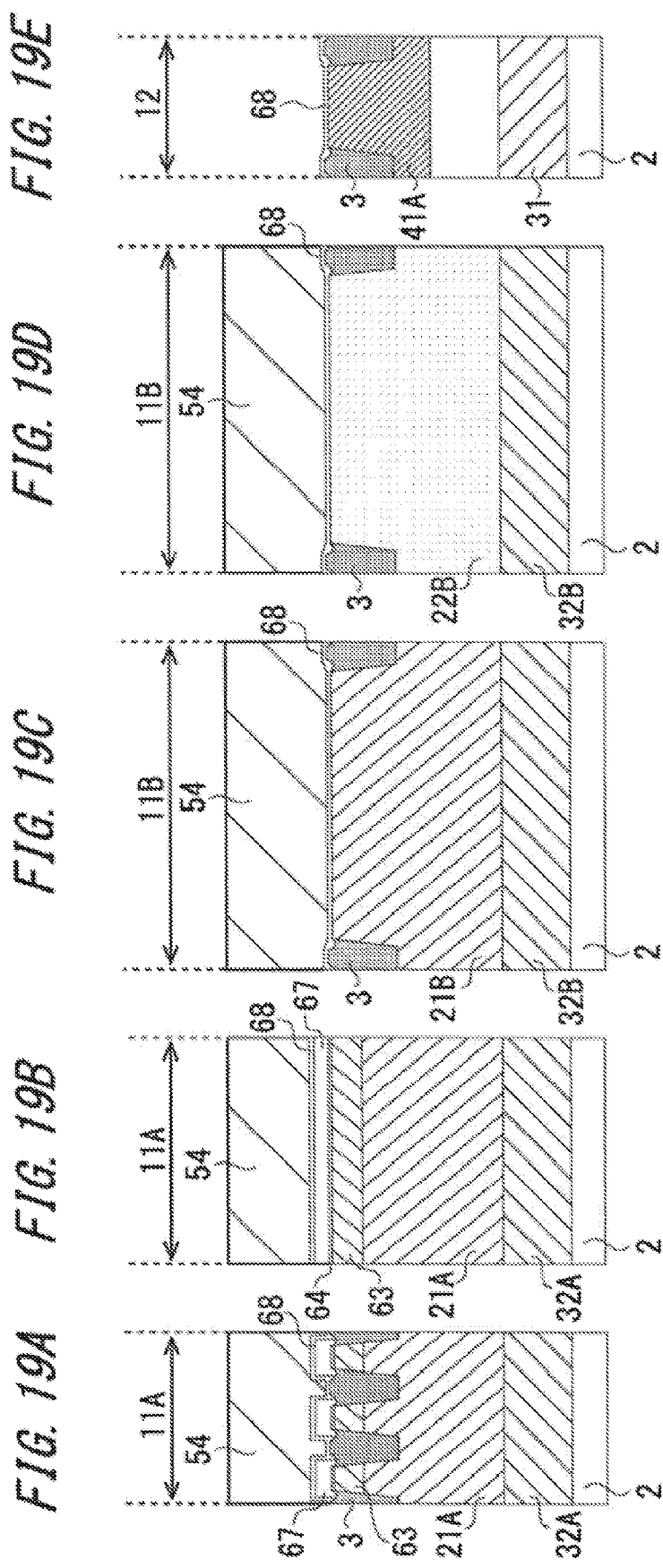

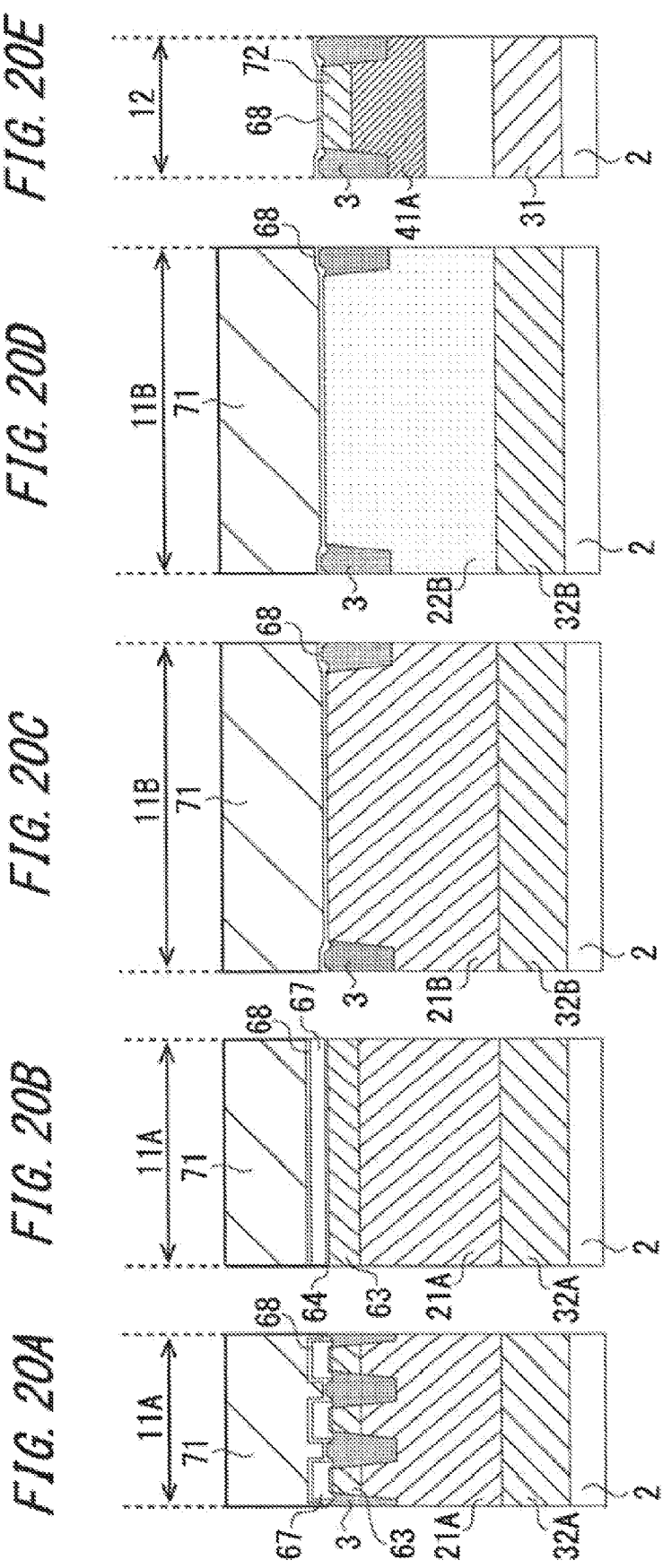

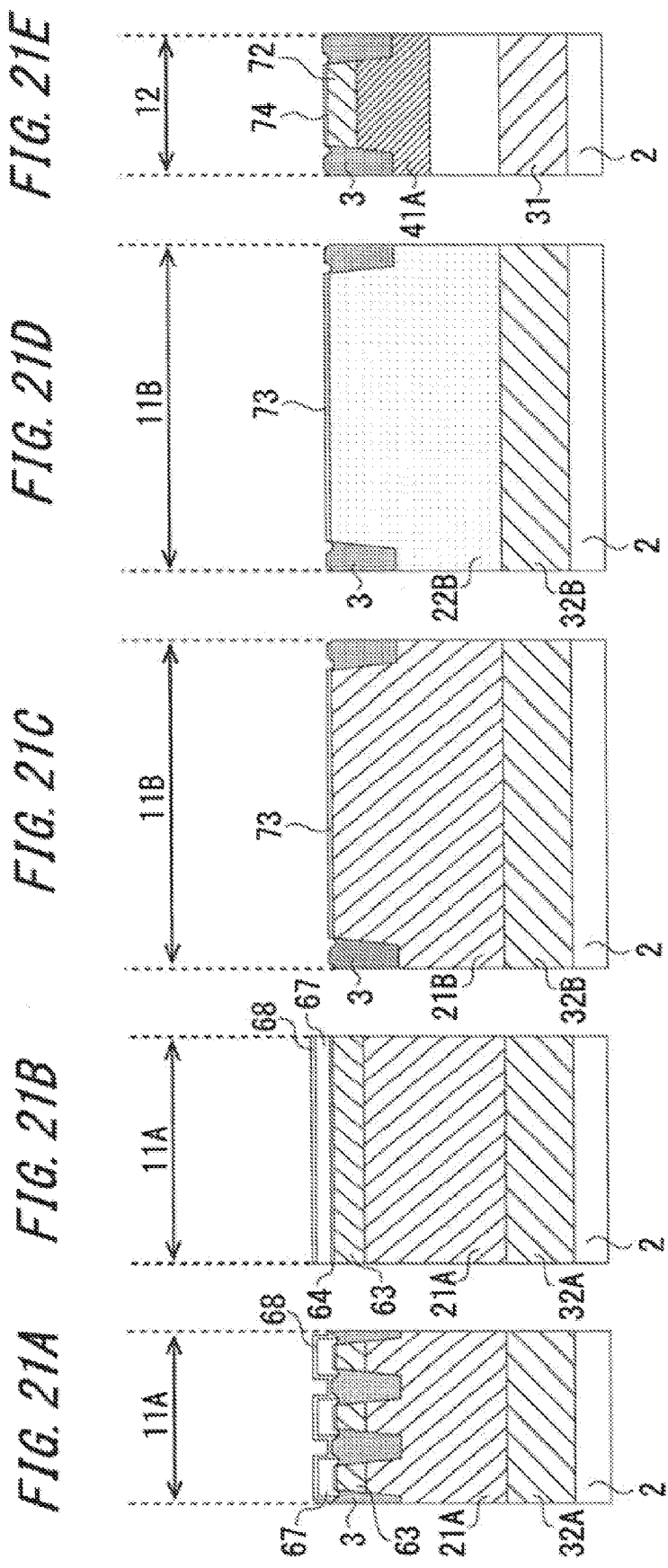

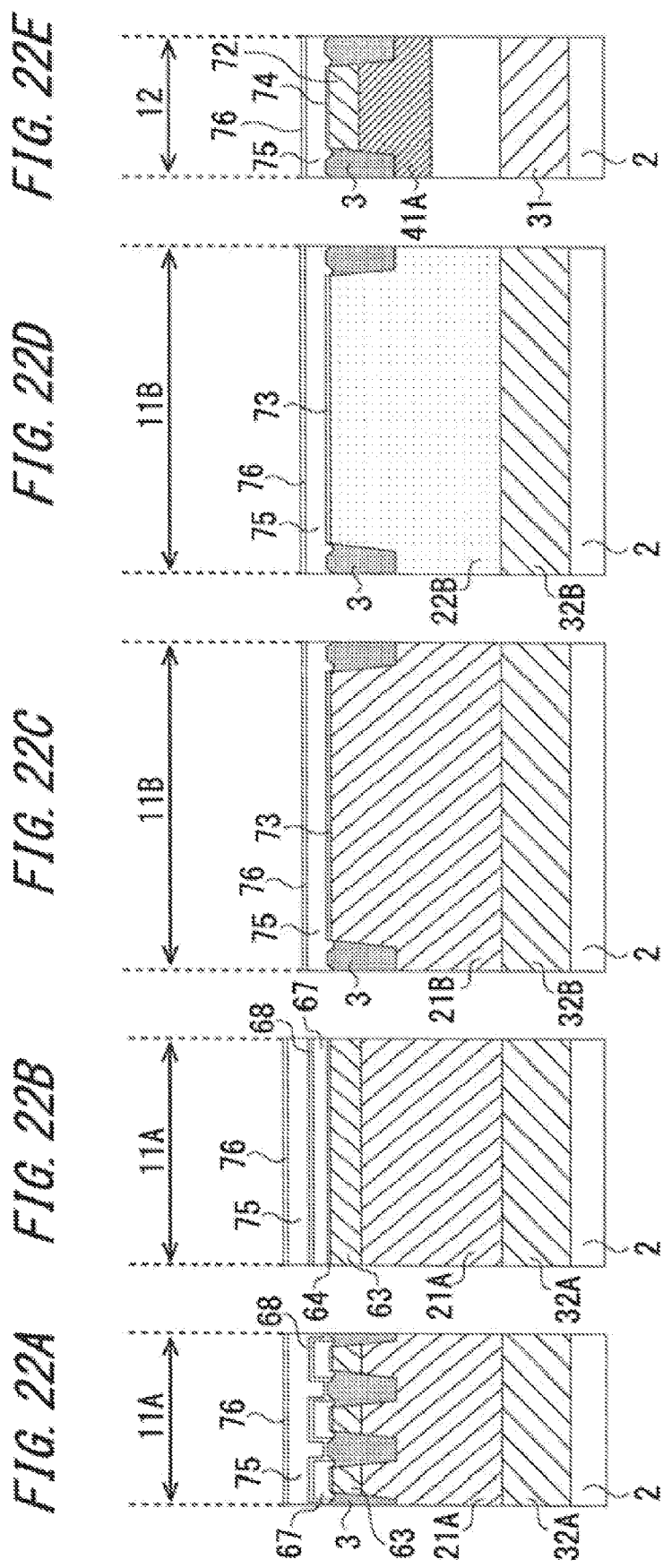

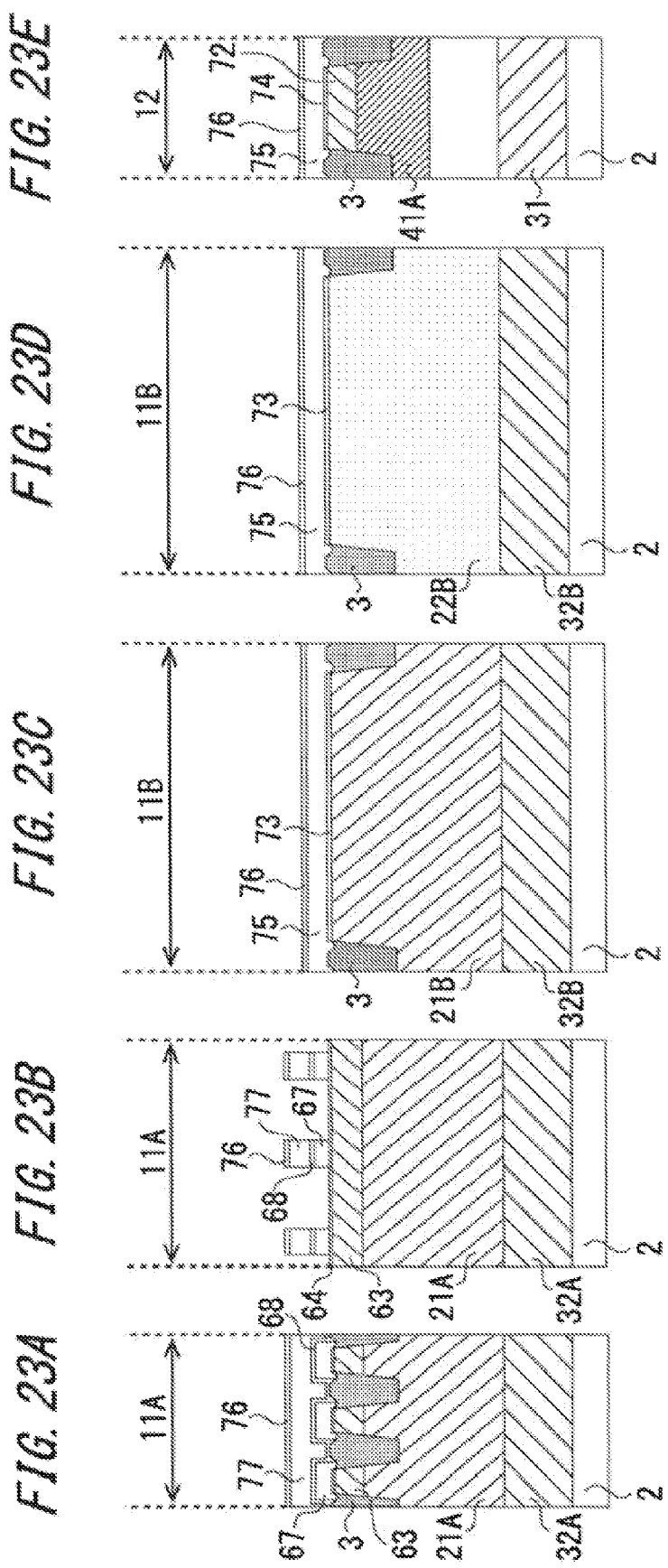

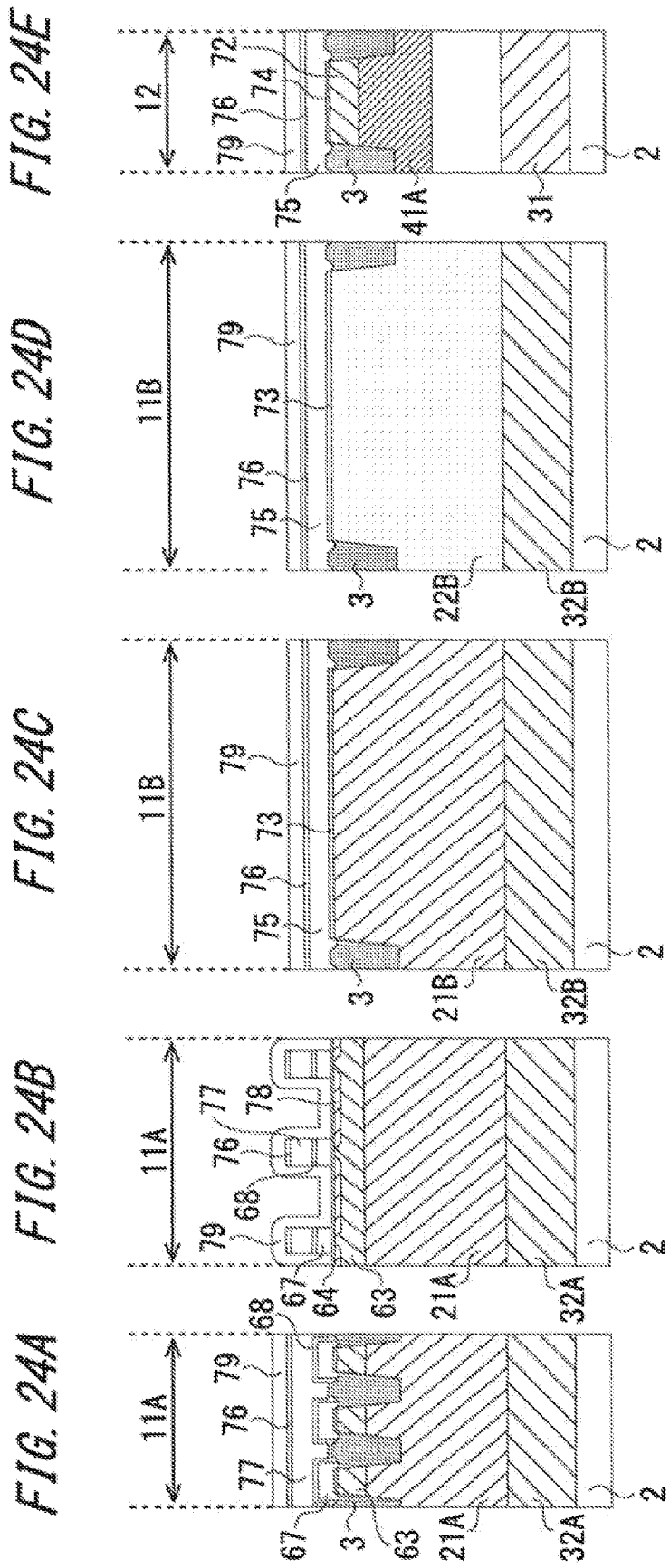

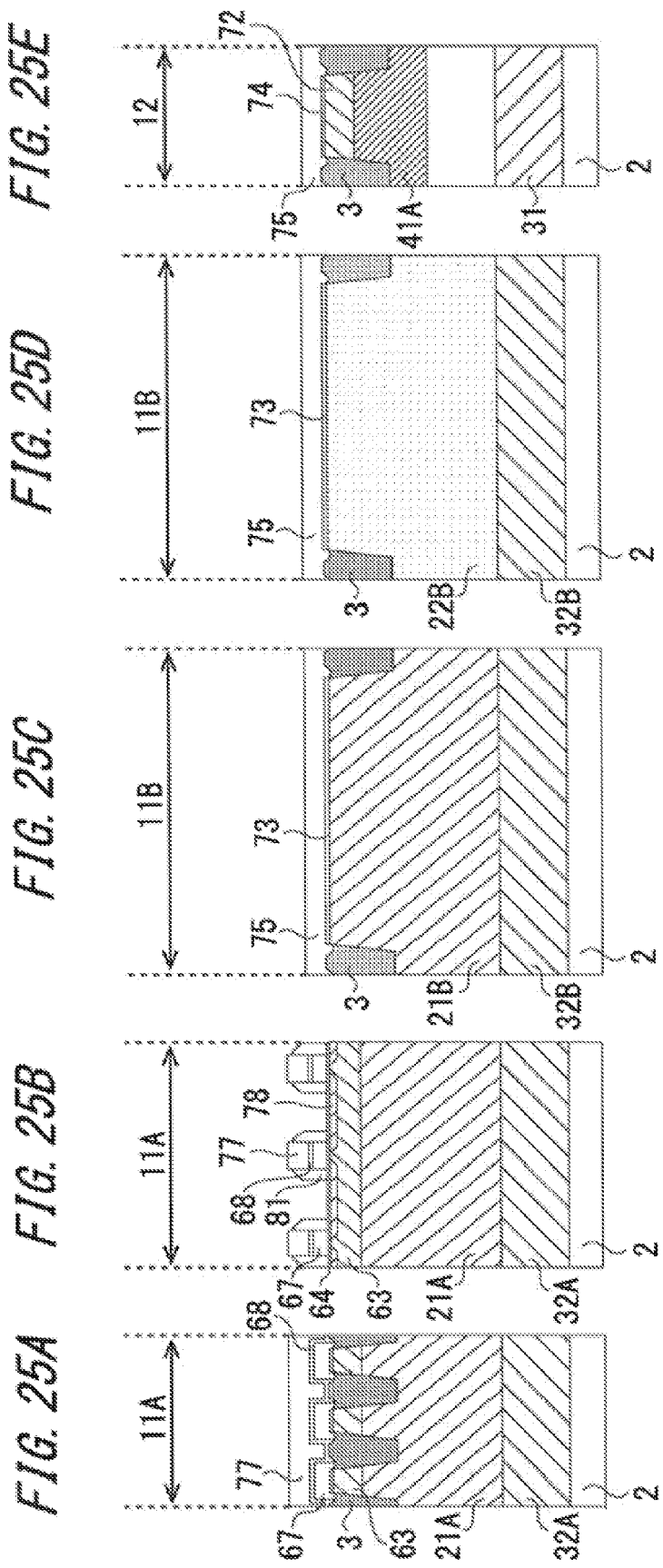

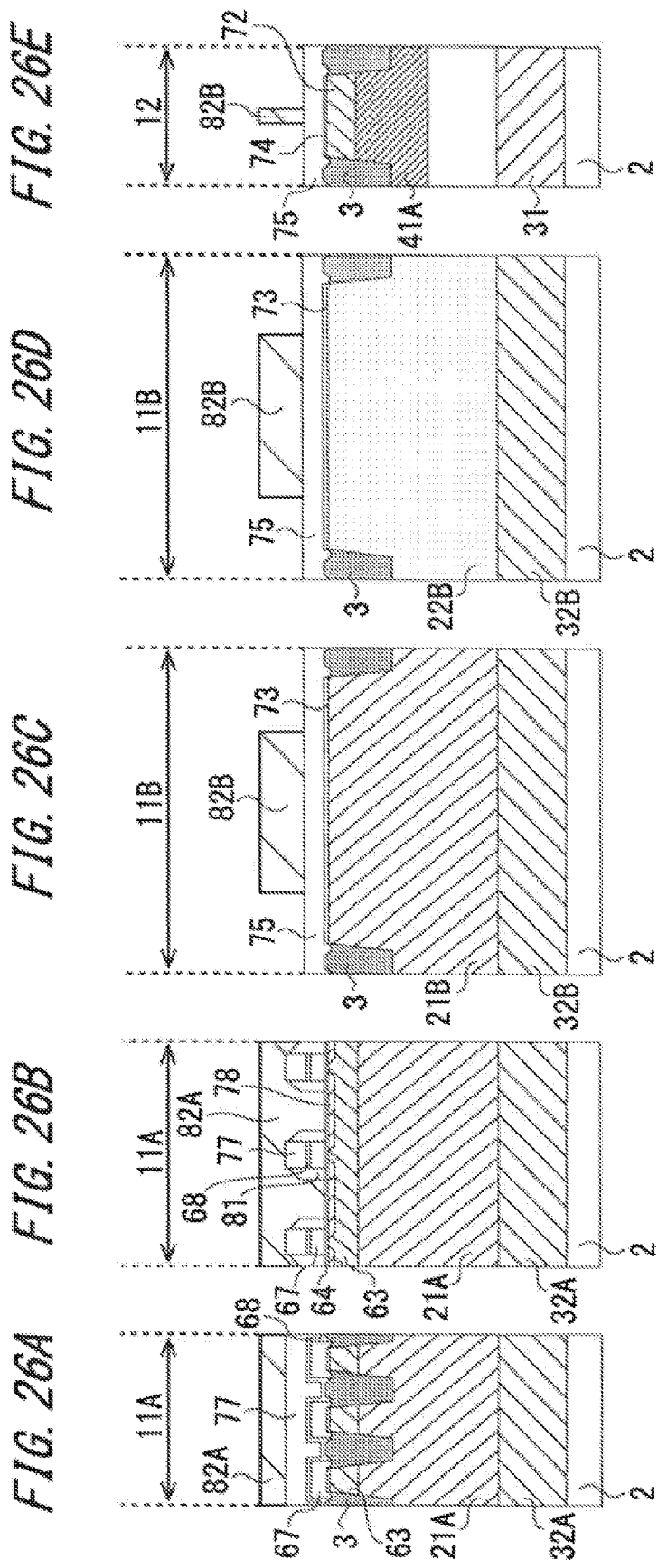

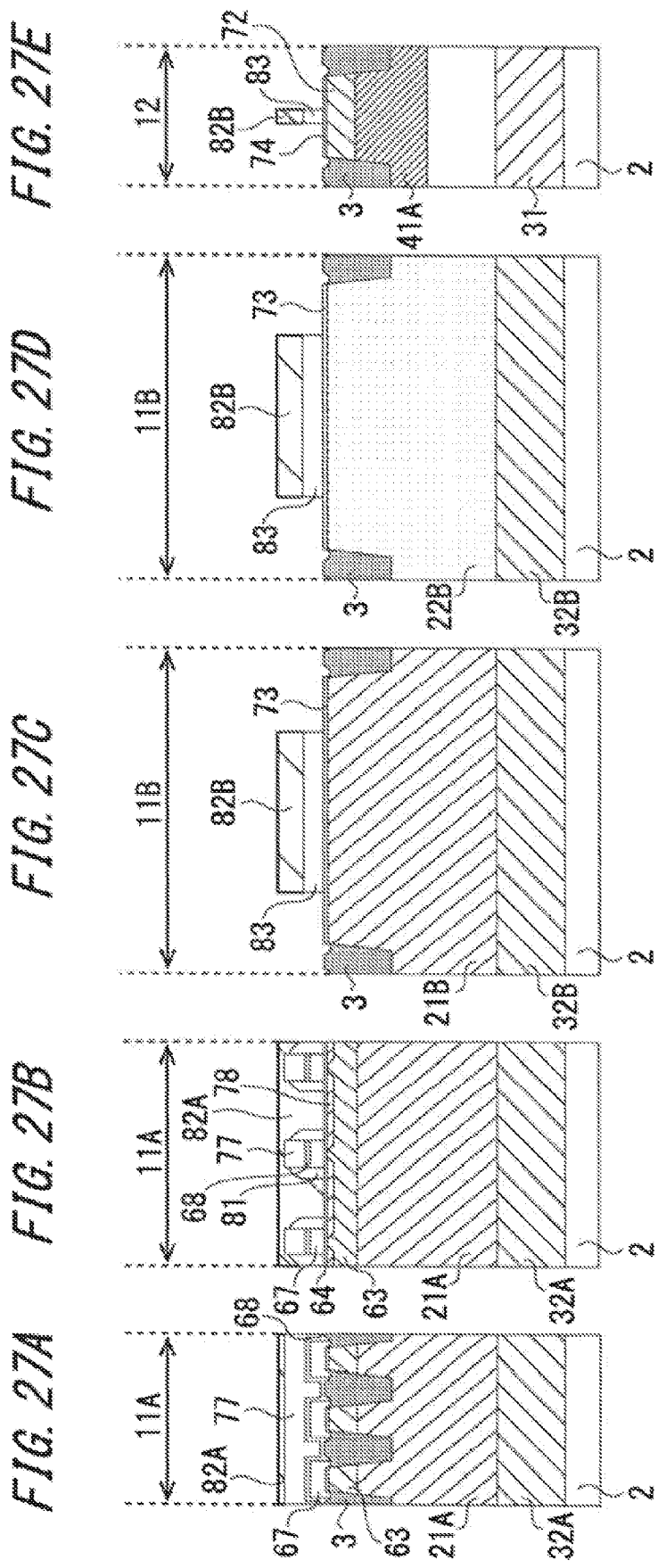

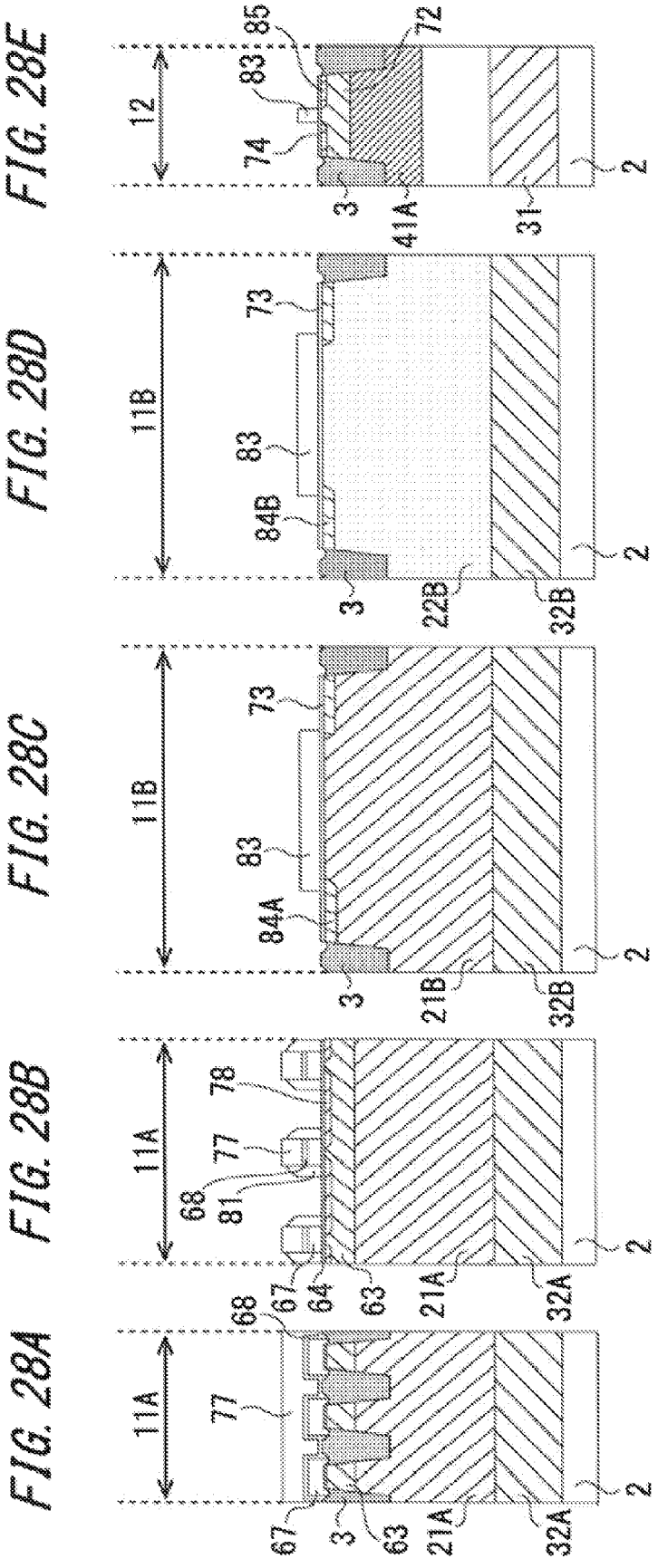

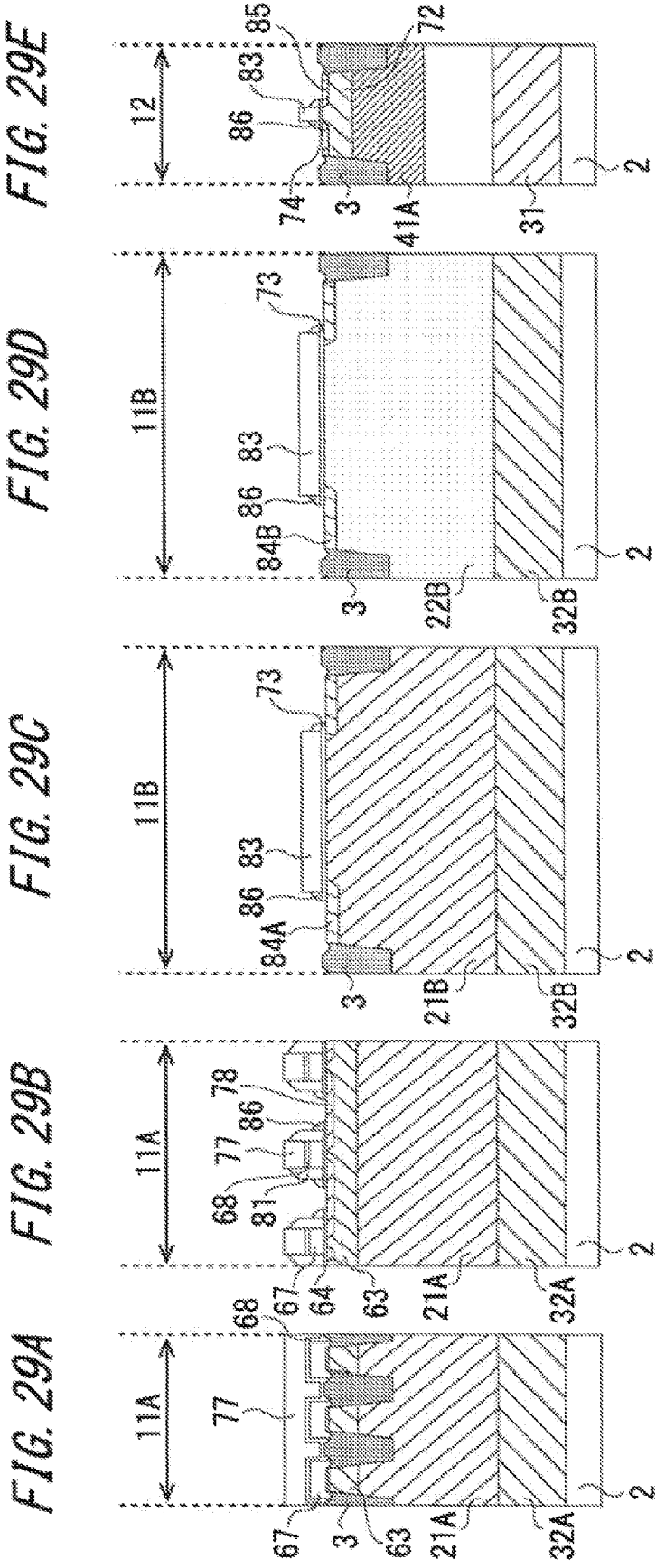

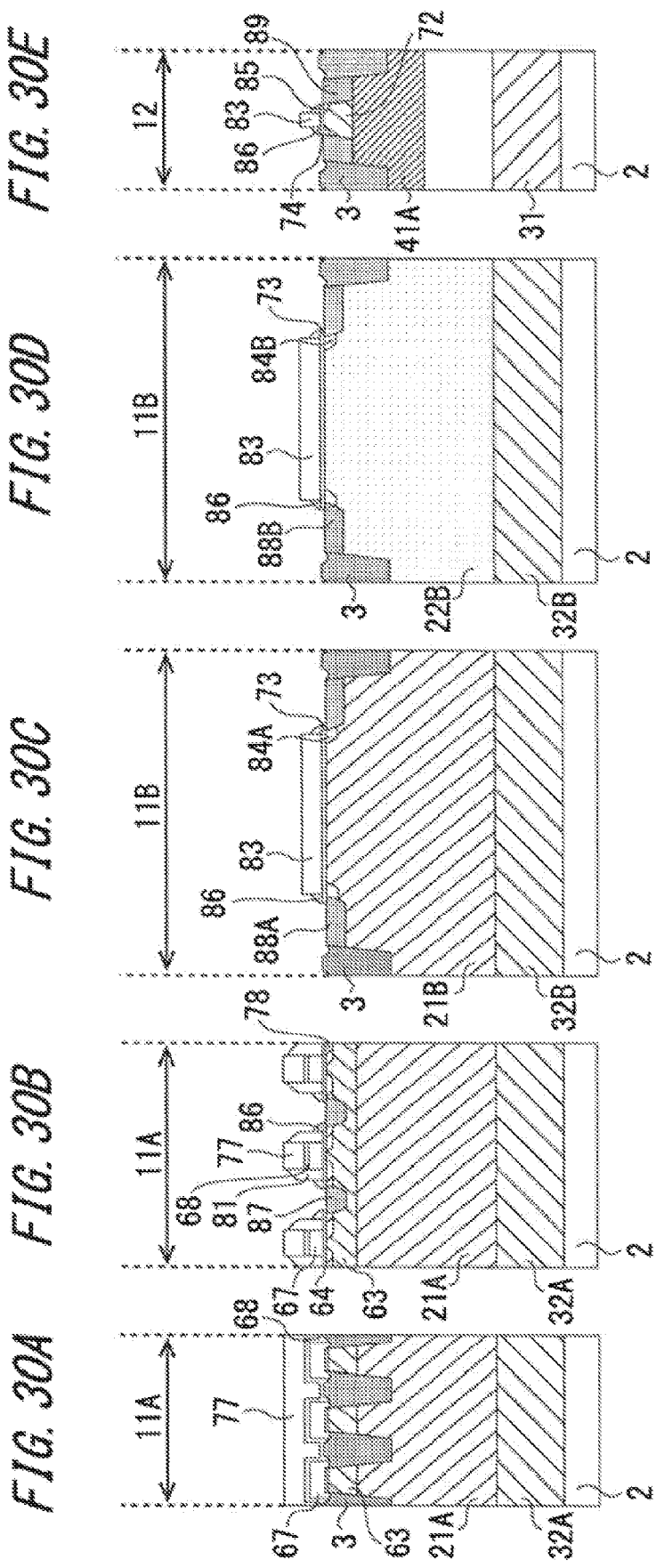

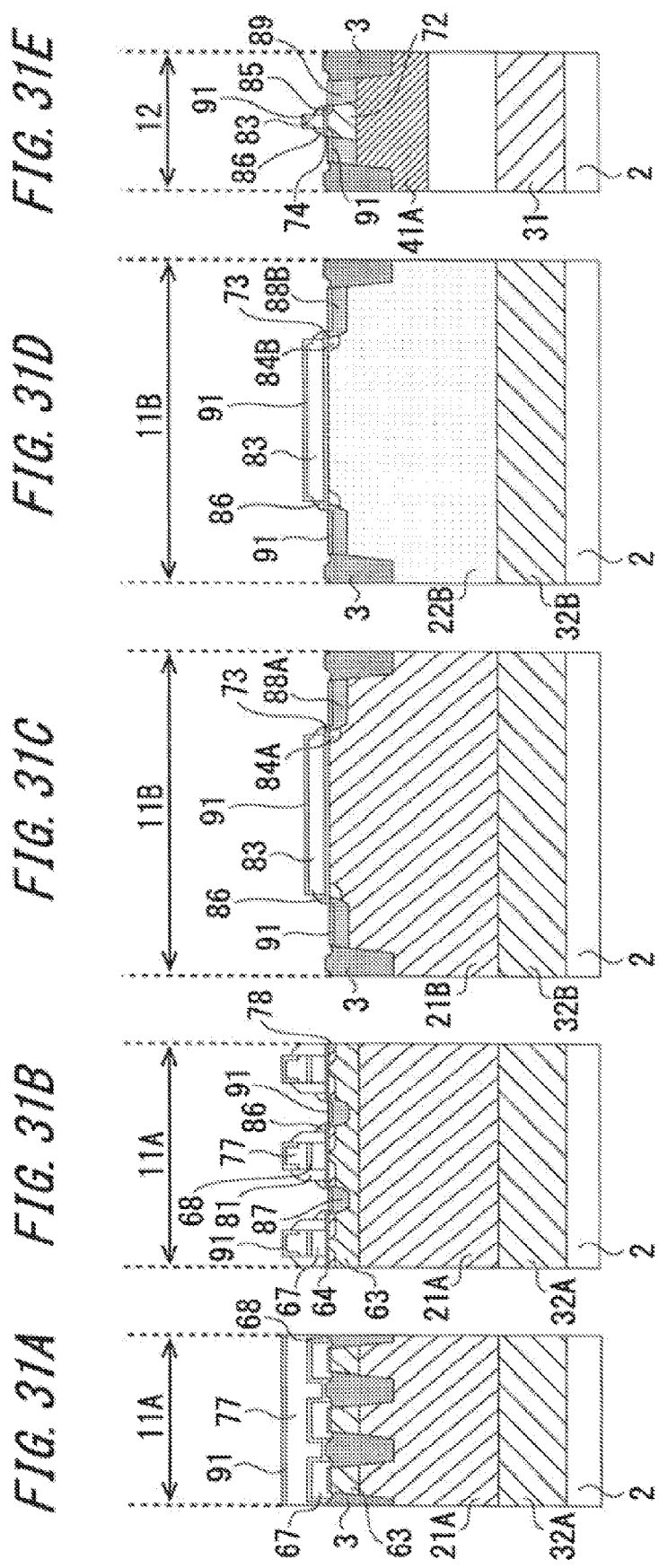

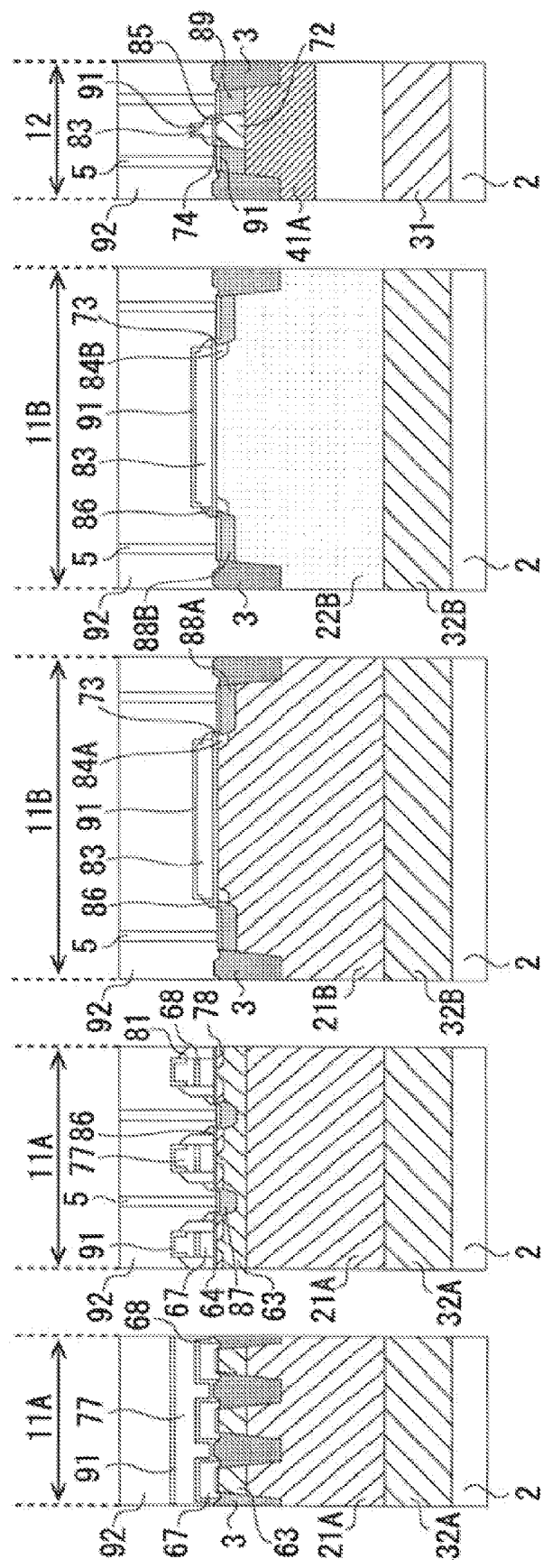

SEMICONDUCTOR DEVICE MANUFACTURING METHOD AND SEMICONDUCTOR DEVICE

CROSS-REFERENCE TO RELATED APPLICATIONS

This application is based upon and claims the benefit of prior Japanese Patent Application No. 2013-231163 filed on Nov. 7, 2013, the entire contents of which are incorporated herein by reference.

FIELD

Embodiments herein relate to a semiconductor device manufacturing method and a semiconductor device.

BACKGROUND

An SRAM (Static Random Access Memory) is a semiconductor device provided with a transfer transistor to be selected by a word line, and two CMOS (Complementary Metal Oxide Semiconductor) inverters connected to a bit line through the transfer transistor. Each CMOS inverter includes an N-type MOS transistor and a P-type MOS transistor. The N-type MOS transistor is formed in a P-type well region (P well) of a semiconductor substrate, whereas the P-type MOS transistor is formed in an N-type well region (N well) of the semiconductor substrate.

In each CMOS inverter, the semiconductor substrate and the transistors are electrically isolated from each other by the well regions. A parasitic thyristor having a pnpn structure is therefore formed between a power supply and a GND terminal in the semiconductor substrate. If radioactive rays are radiated to the SRAM, the parasitic thyristor goes into an electroconductive state, thus in some cases causing latch-up (Single Event Latch-up (SEL)) in which a current continues to flow between the power supply and the GND terminal. Accordingly, a P well high in impurity concentration is formed underneath a region of the semiconductor substrate where the SRAM is formed (hereinafter referred to as the SRAM region) to reduce the resistance of the semiconductor substrate, thereby reducing the occurrence of problems, such as latch-up.

Triple well structures in which a P well is surrounded by N wells are formed in a high-withstand voltage region and an I/O (Input Output) region of the semiconductor substrate. The P well may be formed underneath the SRAM region in some cases in the semiconductor substrate including the SRAM and the triple well structures.

[Patent document 1] Japanese Laid-open Patent Publication No. 05-267606

[Patent document 2] Japanese Laid-open Patent Publication No. 10-135351

SUMMARY

According to an aspect of the embodiment, a semiconductor device manufacturing method includes: performing ion implantation of a first conductivity type to form a first well of the first conductivity type from a first depth of a substrate to a second depth greater than the first depth in the substrate; performing ion implantation of the first conductivity type on a first region of the substrate to form a second well of the first conductivity type at a third depth from a surface of the substrate in the first region of the substrate; performing ion implantation of a second conductivity type different from the first conductivity type on the first region of the substrate to form a third well of the second conductivity type underneath the second well in the first region of the substrate in a position overlapping with the first well located underneath the second well in the first region of the substrate; performing ion implantation of the second conductivity type on the first region of the substrate to form a fourth well, that surrounds the second well in a plan view and has the second conductivity type, at a fourth depth from the surface of the substrate in the first region of the substrate; performing ion implantation of the first conductivity type on a second region of the substrate to form a fifth well of the first conductivity type above the first well in the second region of the substrate; and performing ion implantation of the second conductivity type on the second region of the substrate to form a sixth well of the second conductivity type above the first well in the second region of the substrate.

The aspect and advantages of the embodiment will be realized and attained by means of the elements and combinations particularly pointed out in the claims. It is to be understood that both the foregoing general description and the following detailed description are exemplary and explanatory and are not restrictive of the embodiment, as claimed.

BRIEF DESCRIPTION OF DRAWINGS

FIGS. 9A to 9D are partial plan views of a semiconductor substrate;

FIGS. 10A to 10E are cross-sectional views illustrating one example of a method for manufacturing the semiconductor device according to the embodiment;

FIGS. 11A to 11E are cross-sectional views illustrating one example of the method for manufacturing the semiconductor device according to the embodiment;

FIGS. 12A to 12E are cross-sectional views illustrating one example of the method for manufacturing the semiconductor device according to the embodiment;

FIGS. 13A to 13E are cross-sectional views illustrating one example of the method for manufacturing the semiconductor device according to the embodiment;

FIGS. 14A to 14E are cross-sectional views illustrating one example of the method for manufacturing the semiconductor device according to the embodiment;

FIGS. 15A to 15E are cross-sectional views illustrating one example of the method for manufacturing the semiconductor device according to the embodiment;

FIGS. 16A to 16E are cross-sectional views illustrating one example of the method for manufacturing the semiconductor device according to the embodiment;

FIGS. 17A to 17E are cross-sectional views illustrating one example of the method for manufacturing the semiconductor device according to the embodiment;

FIGS. 18A to 18E are cross-sectional views illustrating one example of the method for manufacturing the semiconductor device according to the embodiment;

FIGS. 19A to 19E are cross-sectional views illustrating one example of the method for manufacturing the semiconductor device according to the embodiment;

FIGS. 20A to 20E are cross-sectional views illustrating one example of the method for manufacturing the semiconductor device according to the embodiment;

FIGS. 21A to 21E are cross-sectional views illustrating one example of the method for manufacturing the semiconductor device according to the embodiment;

FIGS. 22A to 22E are cross-sectional views illustrating one example of the method for manufacturing the semiconductor device according to the embodiment;

FIGS. 23A to 23E are cross-sectional views illustrating one example of the method for manufacturing the semiconductor device according to the embodiment;

FIGS. 24A to 24E are cross-sectional views illustrating one example of the method for manufacturing the semiconductor device according to the embodiment;

FIGS. 25A to 25E are cross-sectional views illustrating one example of the method for manufacturing the semiconductor device according to the embodiment;

FIGS. 26A to 26E are cross-sectional views illustrating one example of the method for manufacturing the semiconductor device according to the embodiment;

FIGS. 27A to 27E are cross-sectional views illustrating one example of the method for manufacturing the semiconductor device according to the embodiment;

FIGS. 28A to 28E are cross-sectional views illustrating one example of the method for manufacturing the semiconductor device according to the embodiment;

FIGS. 29A to 29E are cross-sectional views illustrating one example of the method for manufacturing the semiconductor device according to the embodiment;

FIGS. 30A to 30E are cross-sectional views illustrating one example of the method for manufacturing the semiconductor device according to the embodiment;

FIGS. 31A to 31E are cross-sectional views illustrating one example of the method for manufacturing the semiconductor device according to the embodiment; and FIGS. 32A to 32E are cross-sectional views illustrating one example of the method for manufacturing the semiconductor device according to the embodiment.

DESCRIPTION OF EMBODIMENT

Hereinafter, a semiconductor device and a semiconductor device manufacturing method according to embodiments will be described with reference to the accompanying drawings. The configuration of the semiconductor device and the constitution of the semiconductor device manufacturing method to be described hereinafter are illustrative only, and therefore, not limited to the configuration and the constitution to be described hereinafter.

Figure 1:
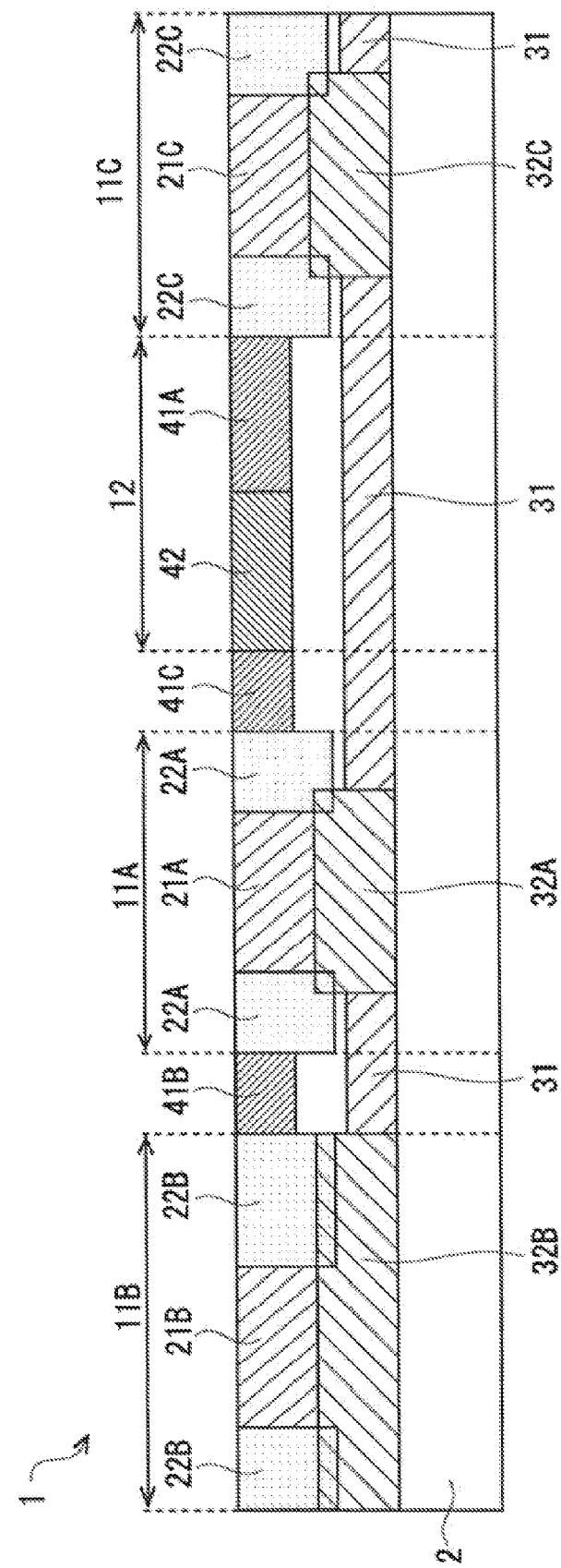
FIG. 1 is a schematic cross-sectional view illustrating the structure of a semiconductor device according to an embodiment.

FIG. 1 is a schematic cross-sectional view illustrating the structure of a semiconductor device 1 according to an embodiment. First, the structure of the semiconductor device 1 according to the embodiment will be described using FIG. 1. As illustrated in FIG. 1, the semiconductor device 1 is provided with a semiconductor substrate 2, and the semiconductor substrate 2 includes high-withstand voltage regions 11A to 11C and an SRAM region 12. The semiconductor substrate 2 is one example of a substrate. The high-withstand voltage regions 11A to 11C are regions where MOS transistors to be driven at high voltages are formed. A plurality of flash memory cells disposed in arrays is formed in the high-withstand voltage region 11A. A circuit, such as a word line decoder, for applying voltages to word lines connected to the flash memory cells are formed in the high-withstand voltage region 11B. A circuit, such as an I/O, is formed in the high-withstand voltage region 11C. An SRAM is formed in the SRAM region 12. The high-withstand voltage regions 11A and 11C are one example of a first region. The SRAM region 12 is one example of a second region. The high-withstand voltage region 11B is one example of a third region.

An HVPW (High Voltage P Well) 21A, an HVNW (High Voltage N Well) 22A, and a DNW (Deep N Well) 32A are formed within the semiconductor substrate 2 in the high-withstand voltage region 11A. The HVNW 22A is formed within the semiconductor substrate 2 in the high-withstand voltage region 11A, so as to surround the HVPW 21A in the horizontal direction thereof. The DNW 32A is formed underneath the HVPW 21A within the semiconductor substrate 2 in the high-withstand voltage region 11A. As described above, in the high-withstand voltage region 11A, the semiconductor substrate 2 has a triple well structure in which the HVPW 21A is surrounded by the HVNW 22A and the DNW 32A.

An HVPW 21B, an HVNW 22B, and a DNW 32B are formed within the semiconductor substrate 2 in the high-withstand voltage region 11B. The HVNW 22B is formed within the semiconductor substrate 2 in the high-withstand voltage region 11B, so as to surround the HVPW 21B in the horizontal direction of the HVPW 21B. The DNW 32B is formed underneath the HVPW 21B and the HVNW 22B within the semiconductor substrate 2 in the high-withstand voltage region 11B. As described above, in the high-withstand voltage region 11B, the semiconductor substrate 2 has a triple well structure in which the HVPW 21B is surrounded by the HVNW 22B and the DNW 32B.

An HVPW 21C, an HVNW 22C, and a DNW 32C are formed within the semiconductor substrate 2 in the high-withstand voltage region 11C. The HVNW 22C is formed within the semiconductor substrate 2 in the high-withstand voltage region 11C, so as to surround the HVPW 21C in the horizontal direction thereof. The DNW 32C is formed underneath the HVPW 21C within the semiconductor substrate 2 in the high-withstand voltage region 11C. As described above, in the high-withstand voltage region 11C, the semiconductor substrate 2 has a triple well structure in which the HVPW 21C is surrounded by the HVNW 22C and the DNW 32C.

An LVPW (Low Voltage P Well) 41A and an LVNW (Low Voltage N Well) 42 are formed within the semiconductor substrate 2 in the SRAM region 12. The LVPW 41A and the LVNW 42 are located above a DPW 31 in the SRAM region 12. An LVPW 41B is formed within the semiconductor substrate 2 between the high-withstand voltage region 11A and the high-withstand voltage region 11B, whereas an LVPW 41C is formed within the semiconductor substrate 2 between the high-withstand voltage region 11A and the SRAM region 12.

DPWs (Deep P Wells) 31 are formed within the semiconductor substrate 2 in the horizontal direction of the DNWs 32A to 32C. Accordingly, the DPW 31 is formed underneath the LVPW 41A and the LVNW 42 in the SRAM region 12. An upper portion of the DPW 31 may be connected to the bottoms (lower portions) of the LVPW 41A and the LVNW 42. The upper portion of the DPW 31 may be apart from the bottoms of the LVPW 41A and the LVNW 42. The DPW 31 is a P well high in impurity concentration. Since the DPW 31 is formed underneath the LVPW 41A and the LVNW 42 in the SRAM region 12, the resistance of the semiconductor substrate 2 lowers, thus reducing the occurrence of latch-up in the SRAM formed in the SRAM region 12.

Neutrons implanted at high energy collide with electrons to emit α rays. The α rays, while advancing within silicon, ionize electrons by means of interaction based on coulomb force. Some of the electrons thus generated are collected in a depletion layer due to funneling. As the result of the DPW 31 serving as a barrier against funneling, the occurrence of the latch-up is reduced in the SRAM formed in the SRAM region 12. Funneling is a phenomenon in which the intensity of electric fields in the depletion layer is relieved by electrical charges generated along the tracks of ions and electrical charges are collected from regions external to the depletion layer.

The HVPWs 21A to 21C, the DPW 31, and the LVPWs 41A to 41C are P-type wells, whereas the HVNWs 22A to 22C, the DNWs 32A to 32C, and the LVNW 42 are N-type wells. A P type is one example of a first conductivity type, whereas an N type is one example of a second conductivity type different from the first conductivity type. Note however that the N-type may be the first conductivity type and the P-type may be the second conductivity type. The DPW 31 is one example of a first well. The HVPWs 21A and 21C are one example of a second well. The DNWs 32A and 32C are one example of a third well. The HVNWs 22A and 22C are one example of a fourth well. The LVPW 41A is one example of a fifth well. The LVNW 42 is one example of a sixth well. The DNW 32B is one example of a seventh well. The HVNW 22B is one example of an eighth well. The HVPW 21B is one example of a ninth well.

The DPWs 31s are formed in a region ranging from a first depth of the semiconductor substrate 2 to a second depth thereof greater than the first depth. The HVPWs 21A to 21C are formed in a region ranging from a surface of the semiconductor substrate 2 to a third depth thereof. The HVNWs 22A to 22C are formed in a region ranging from the surface of the semiconductor substrate 2 to a fourth depth thereof. The DNWs 32A to 32C are formed in a region ranging from a fifth depth of the semiconductor substrate 2 to a sixth depth thereof greater than the fifth depth. The LVPWs 41A to 41C are formed in a region ranging from the surface of the semiconductor substrate 2 to a seventh depth thereof. The LVNW 42 is formed in a region ranging from the surface of the semiconductor substrate 2 to an eighth depth thereof. According to the embodiment, it is possible to reduce the occurrence of problems in the semiconductor device and suppress an increase in the number of manufacturing process steps.

Figure 2:
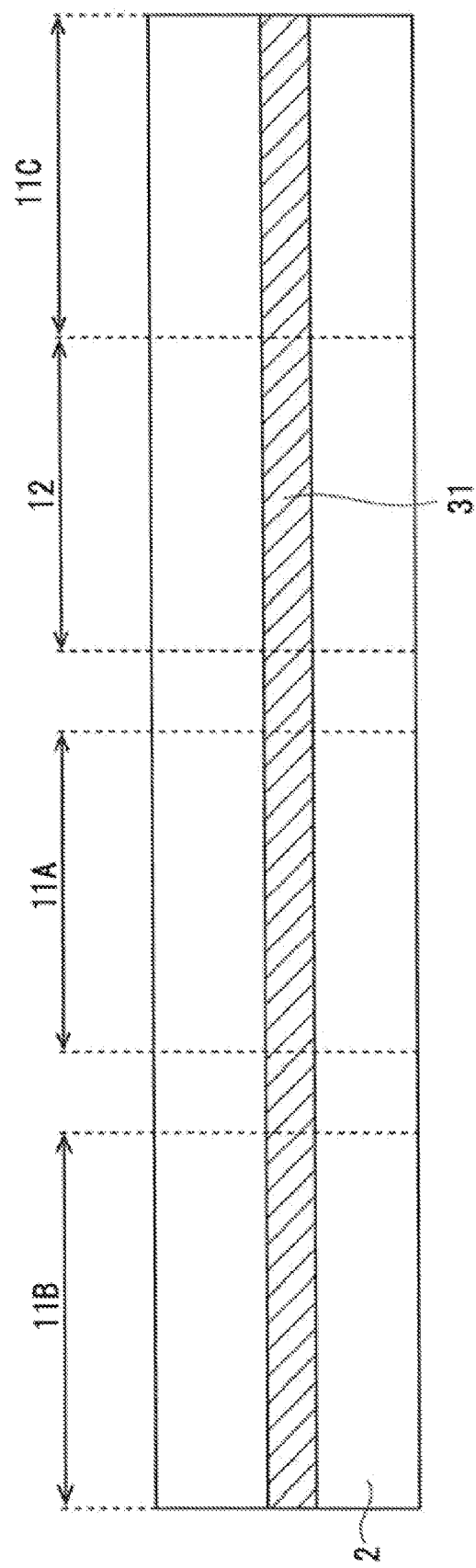
FIG. 2 is a cross-sectional view illustrating one example of a process for manufacturing the semiconductor device according to the embodiment.
Figure 3:
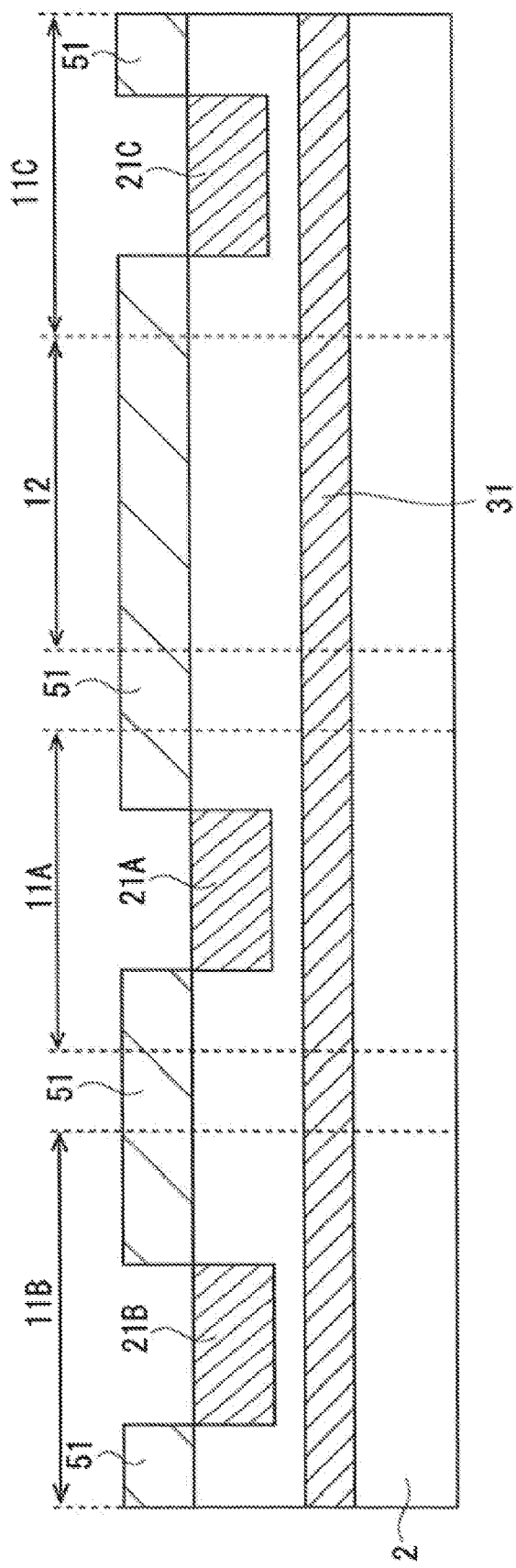
FIG. 3 is a cross-sectional view illustrating one example of a process for manufacturing the semiconductor device according to the embodiment.

A process up to the step of forming the structure illustrated in FIG. 1 will be described with reference to FIGS. 2 to 7. FIGS. 2 to 7 are cross-sectional views illustrating one example of the manufacturing process of the semiconductor device 1 according to the embodiment. First, as illustrated in FIG. 2, the semiconductor substrate 2 is prepared, and a P-type impurity is ion-implanted in the entire surface of the semiconductor substrate 2 without using a resist pattern-based mask (maskless) to form the DPWs 31 in the semiconductor substrate 2. Next, as illustrated in FIG. 3, a P-type impurity is ion-implanted in the semiconductor substrate 2 using a resist pattern 51 in which parts of the high-withstand voltage regions 11A to 11C are opened as a mask. Consequently, the HVPWs 21A to 21C are formed within the semiconductor substrate 2 in the high-withstand voltage regions 11A to 11C. The resist pattern 51 is one example of a first resist.

Figure 4:
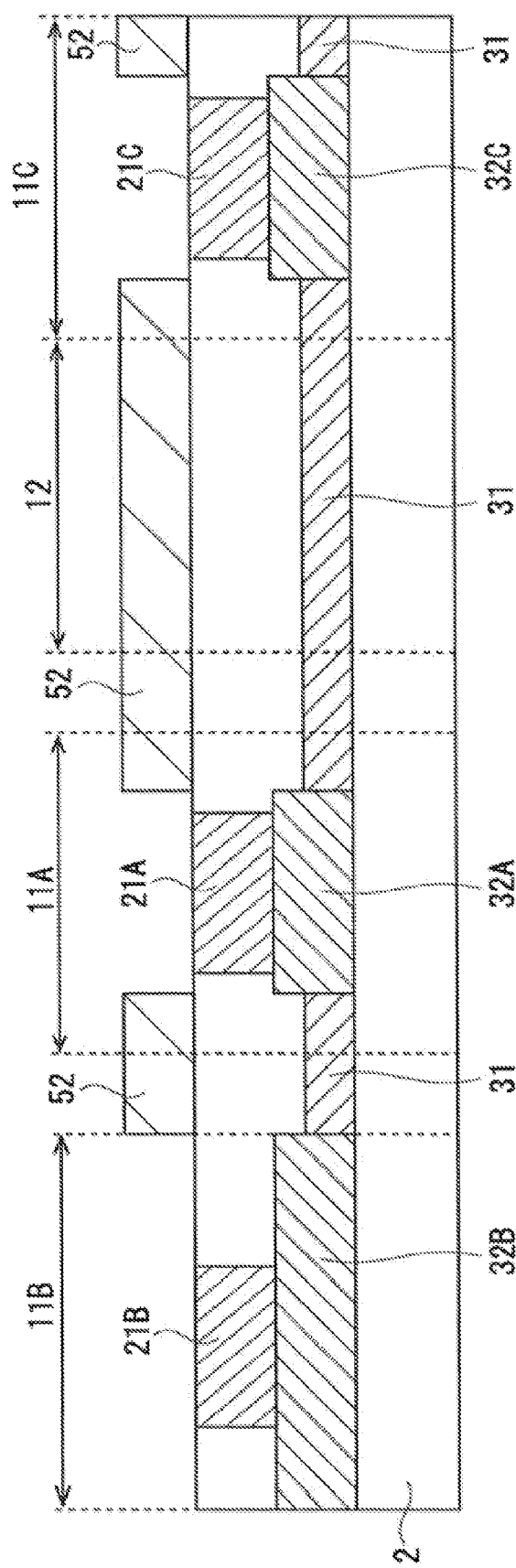
FIG. 4 is a cross-sectional view illustrating one example of a process for manufacturing the semiconductor device according to the embodiment.

Subsequently, as illustrated in FIG. 4, an N-type impurity is ion-implanted in the semiconductor substrate 2 using a resist pattern 52 in which parts of the high-withstand voltage regions 11A and 11C and the high-withstand voltage region 11B are opened as a mask. The N-type impurity is ion-implanted at a dose amount larger than the dose amount of ion implantation (amount of implantation) at the time of forming the DPW 31. The P-type impurity ion-implanted in the semiconductor substrate 2 is compensated for by the N-type impurity ion-implanted in the semiconductor substrate 2. Consequently, the DPW 31s formed within the semiconductor substrate 2 in high-withstand voltage regions 11A to 11C are annihilated, and the DNWs 32A to 32C are formed within the semiconductor substrate 2 in the high-withstand voltage regions 11A to 11C. That is, the DNWs 32A to 32C overlapping with the DPW 31s underneath the HVPWs 21A to 21C are formed within the semiconductor substrate 2 in the high-withstand voltage regions 11A to 11C. The resist pattern 52 is one example of a second resist.

The DPW 31 formed underneath the HVPW 21A in the high-withstand voltage region 11A is annihilated, and the DNW 32A is formed underneath the HVPW 21A within the semiconductor substrate 2 in the high-withstand voltage region 11A. That is, the DNW 32A overlapping with the DPW 31 underneath the HVPW 21A is formed within the semiconductor substrate 2 in the high-withstand voltage region 11A. The DPW 31 formed underneath the HVPW 21C in the high-withstand voltage region 11C is annihilated, and the DNW 32C is formed underneath the HVPW 21C within the semiconductor substrate 2 in the high-withstand voltage region 11C. That is, the DNW 32C overlapping with the DPW 31 underneath the HVPW 21C is formed within the semiconductor substrate 2 in the high-withstand voltage region 11C.

The DPW 31 formed within the semiconductor substrate 2 in the high-withstand voltage region 11B is annihilated, and the DNW 32B is formed within the semiconductor substrate 2 in a region ranging from the fifth depth to the sixth depth of the semiconductor substrate 2 in the high-withstand voltage region 11B. That is, the DNW 32B overlapping with the DPW 31 is formed within the semiconductor substrate 2 in the high-withstand voltage region 11B. The DNW 32B is formed in a region ranging from the fifth depth to the sixth depth of the semiconductor substrate 2 in the high-withstand voltage region 11B, so as to extend in the horizontal direction of the semiconductor substrate 2. Accordingly, the DNW 32B is formed underneath the HVPW 21B and the peripheral region of the HVPW 21B within the semiconductor substrate 2 in the high-withstand voltage region 11B.

Figure 5:
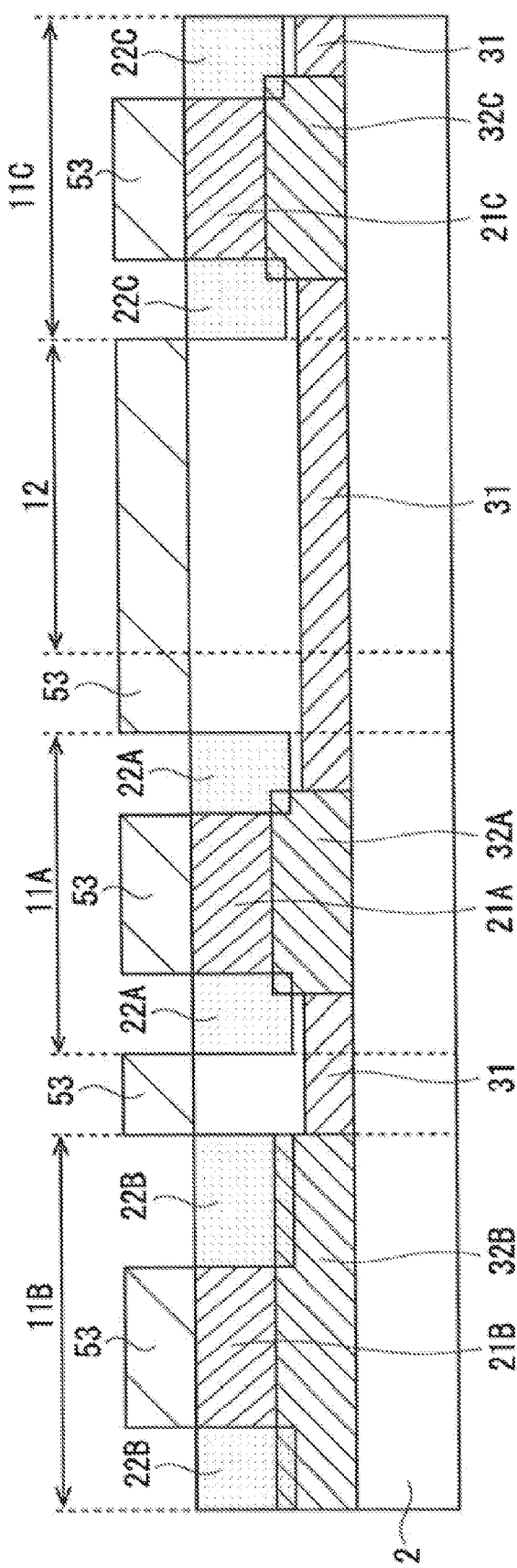
FIG. 5 is a cross-sectional view illustrating one example of a process for manufacturing the semiconductor device according to the embodiment.

Next, as illustrated in FIG. 5, an N-type impurity is ion-implanted in the semiconductor substrate 2 using a resist pattern 53 in which parts of the high-withstand voltage regions 11A to 11C are opened as a mask. Consequently, the HVNWs 22A to 22C are formed within the semiconductor substrate 2 in the high-withstand voltage regions 11A to 11C. The resist pattern 53 is one example of a third resist.

The HVNW 22A surrounding the HVPW 21A in the horizontal direction thereof is formed within the semiconductor substrate 2 in the high-withstand voltage region 11A. The DNW 32A is formed so that the outer edge thereof is positioned outside the outer edge of the HVPW 21A in a plan view. That is, the outer edge of the DNW 32A is positioned outside the outer edge of the HVPW 21A in a plan view. The HVNW 22A is formed so that the bottom thereof is positioned deeper than the bottom of the HVPW 21A. That is, the bottom of the HVNW 22A is positioned deeper than the bottom of the HVPW 21A. Consequently, part of the HVNW 22A and part of the DNW 32A overlap with each other. The connecting part between the HVNW 22A and the DNW 32A widens as the result of part of the HVNW 22A and part of the DNW 32A overlapping with each other, and therefore, the resistance between the HVNW 22A and the DNW 32A lowers. A decrease in the resistance between the HVNW 22A and the DNW 32A reduces the occurrence of latch-up in the high-withstand voltage region 11A.

The HVNW 22B surrounding the HVPW 21B in the horizontal direction thereof is formed within the semiconductor substrate 2 in the high-withstand voltage region 11B. The DNW 32B is formed so that the outer edge thereof is positioned outside the outer edge of the HVPW 21B in a plan view. That is, the outer edge of the DNW 32B is positioned outside the outer edge of the HVPW 21B in a plan view. The HVNW 22B is formed so that the bottom thereof is positioned deeper than the bottom of the HVPW 21B. That is, the bottom of the HVNW 22B is positioned deeper than the bottom of the HVPW 21B. Consequently, part of the HVNW 22B and part of the DNW 32B overlap with each other. The connecting part between the HVNW 22B and the DNW 32B widens as the result of part of the HVNW 22B and part of the DNW 32B overlapping with each other, and therefore, the resistance between the HVNW 22B and the DNW 32B lowers. A decrease in the resistance between the HVNW 22B and the DNW 32B reduces the occurrence of latch-up in the high-withstand voltage region 11B.

The HVNW 22C surrounding the HVPW 21C in the horizontal direction thereof is formed within the semiconductor substrate 2 in the high-withstand voltage region 11C. The DNW 32C is formed so that the outer edge thereof is positioned outside the outer edge of the HVPW 21C in a plan view. That is, the outer edge of the DNW 32C is positioned outside the outer edge of the HVPW 21C in a plan view. The HVNW 22C is formed so that the bottom thereof is positioned deeper than the bottom of the HVPW 21C. That is, the bottom of the HVNW 22C is positioned deeper than the bottom of the HVPW 21C. Consequently, part of the HVNW 22C and part of the DNW 32C overlap with each other. The connecting part between the HVNW 22C and the DNW 32C widens as the result of part of the HVNW 22C and part of the DNW 32C overlapping with each other, and therefore, the resistance between the HVNW 22C and the DNW 32C lowers. A decrease in the resistance between the HVNW 22C and the DNW 32C reduces the occurrence of latch-up in the high-withstand voltage region 11C.

Figure 6:
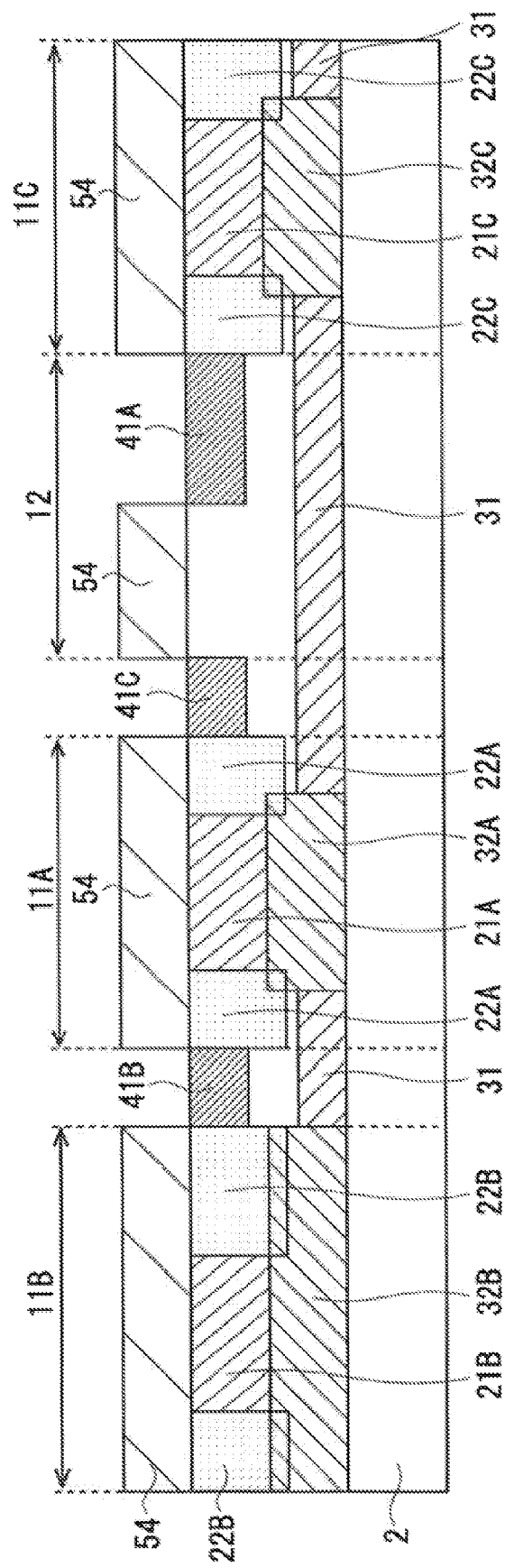
FIG. 6 is a cross-sectional view illustrating one example of a process for manufacturing the semiconductor device according to the embodiment.

Subsequently, as illustrated in FIG. 6, a P-type impurity is ion-implanted in the semiconductor substrate 2 using a resist pattern 54 in which part of the SRAM region 12, the portion between the high-withstand voltage region 11A and the high-withstand voltage region 11B, and the portion between the high-withstand voltage region 11A and the SRAM region 12 are opened as a mask. Consequently, the LVPW 41A is formed above the DPW 31 within the semiconductor substrate 2 in the SRAM region 12. In addition, the LVPW 41B is formed within the semiconductor substrate 2 between the high-withstand voltage region 11A and the high-withstand voltage region 11B, and the LVPW 41C is formed within the semiconductor substrate 2 between the high-withstand voltage region 11A and the SRAM region 12. The resist pattern 54 is one example of a fourth resist.

Figure 7:
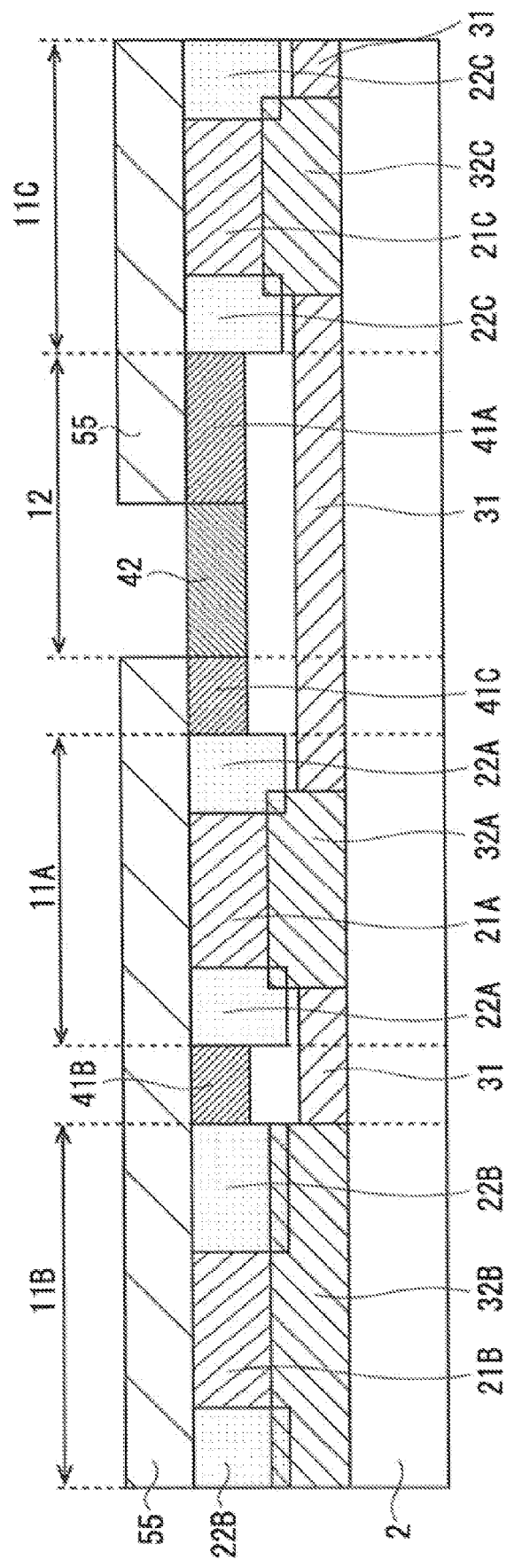
FIG. 7 is a cross-sectional view illustrating one example of a process for manufacturing the semiconductor device according to the embodiment.

Next, as illustrated in FIG. 7, an N-type impurity is ion-implanted in the semiconductor substrate 2 using a resist pattern 55 in which part of the SRAM region 12 is opened as a mask. Consequently, the LVNW 42 is formed above the DPW 31 within the semiconductor substrate 2 in the SRAM region 12. The resist pattern 55 is one example of a fifth resist.

Figure 8:
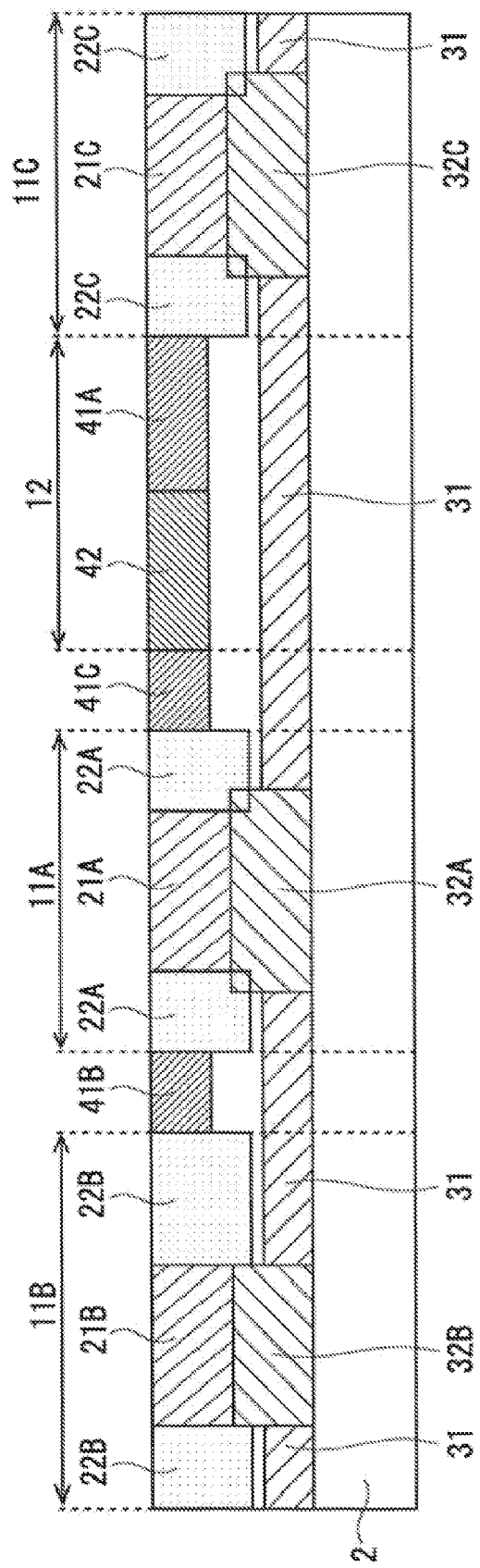
FIG. 8 is a schematic cross-sectional view illustrating the structure of a semiconductor device according to a reference example.

If the DPW 31 is formed underneath the HVNW 22B in the high-withstand voltage region 11B as illustrated in, for example, FIG. 8, the parasitic capacitance of the HVNW 22B increases. FIG. 8 is a schematic cross-sectional view illustrating the structure of a semiconductor device according to a reference example. A high voltage is applied to the HVNW 22B in the high-withstand voltage region 11B at the time of writing into (programming) and clearing (erasing) a flash memory cell formed in the high-withstand voltage region 11A. Accordingly, the parasitic capacitance of the HVNW 22B affects operating speed in a circuit, such as a word line decoder, formed in the high-withstand voltage region 11B. In the semiconductor device 1 according to the embodiment, the DNW 32B is formed underneath the HVPW 21B and the HVNW 22B in the high-withstand voltage region 11B, as illustrated in FIG. 1. By forming the DNW 32B underneath the HVNW 22B, the increase of parasitic capacitance in the HVNW 22B is suppressed, thus improving operating speed in the circuit, such as a word line decoder, formed in the high-withstand voltage region 11B.

According to the manufacturing method of the semiconductor device 1 in accordance with the embodiment, a P-type impurity is ion-implanted without using a resist pattern-based mask to form the DPW 31 underneath the LVPW 41A and the LVNW 42 in the SRAM region 12. Accordingly, two steps are decreased, compared with a case where ion implantation is performed using a resist pattern in which the SRAM region 12 is opened as a mask to form the DPW 31 underneath the LVPW 41A and the LVNW 42 in the SRAM region 12. That is, according to the manufacturing method of the semiconductor device 1 in accordance with the embodiment, a reduction is made of two steps, i.e., the step of forming the resist pattern in which the SRAM region 12 is opened and the step of removing the resist pattern. Consequently, according to the manufacturing method of the semiconductor device 1 in accordance with the embodiment, it is possible to reduce the occurrence of latch-up in the semiconductor device 1 and suppress an increase in the number of manufacturing process steps.

FIG. 1 and FIGS. 5 to 7 illustrate an example in which the HVNW 22B in the high-withstand voltage region 11B is formed so as to surround the HVPW 21B in the horizontal direction thereof. Without limitation to this example, the HVNW 22B in the high-withstand voltage region 11B may be formed adjacently to the HVPW 21B in the horizontal direction thereof.

FIG. 1 illustrates an example in which the DNW 32B is formed underneath the HVPW 21B and the HVNW 22B in the high-withstand voltage region 11B. Without limitation to this example, the DPW 31 may be formed underneath the HVPW 21B in the high-withstand voltage region 11B, and the DNW 32B may be formed underneath the HVNW 22B in the high-withstand voltage region 11B. In a structure in which any HVPWs are not present in the vicinity of an HVNW, a DNW may be formed underneath the HVNW.

The order of the manufacturing process illustrated in FIGS. 2 to 7 is merely one example. Accordingly, the order in which the HVPWs 21A to 21C, the HVNWs 22A to 22C, the DPWs 31, the DNWs 32A to 32C, the LVPWs 41A to 41C and the LVNW 42 are formed is not limited to the order of the manufacturing process illustrated in FIGS. 2 to 7.

A description will be made of one example of the manufacturing method of the semiconductor device 1 according to the embodiment. FIG. 9A is a partial plan view of the semiconductor substrate 2 in the high-withstand voltage region 11A and illustrates a region where a flash memory cell is to be formed. FIG. 9B is a partial plan view of the semiconductor substrate 2 in the high-withstand voltage region 11B and illustrates a region where an NMOS transistor is to be formed. FIG. 9C is a partial plan view of the semiconductor substrate 2 in the high-withstand voltage region 11B and illustrates a region where a PMOS transistor is to be formed. FIG. 9D is a partial plan view of the semiconductor substrate 2 in the SRAM region 12 and illustrates a region where an NMOS transistor is to be formed. FIGS. 9A to 9D are schematic views and illustrate element-isolating insulating films 3, active regions 4, contact plugs 5, control gates 77, and gate electrodes 83. Although a PMOS transistor is to be formed in the semiconductor substrate 2 in the SRAM region 12, the region where the PMOS transistor is to be formed is excluded from the illustrations in FIGS. 9A to 9D. Although an NMOS transistor and a PMOS transistor are to be formed in the semiconductor substrate 2 in the high-withstand voltage region 11C, the region where the NMOS transistor and the PMOS transistor are to be formed is excluded from the illustrations in FIGS. 9A to 9D.

FIGS. 10A to 32E are cross-sectional views illustrating each step in one example of the manufacturing method of the semiconductor device 1 according to the embodiment. FIGS. 10A, 11A, 12A, 13A, 14A, 15A, 16A, 17A, 18A, 19A, 20A, 21A, 22A, 23A, 24A, 25A, 26A, 27A, 28A, 29A, 30A, 31A and 32A correspond to views taken on the single-dot chain line A-A' of FIG. 9A and illustrate cross sections of the semiconductor substrate 2 in the high-withstand voltage region 11A. FIGS. 10B, 11B, 12B, 13B, 14B, 15B, 16B, 17B, 18B, 19B, 20B, 21B, 22B, 23B, 24B, 25B, 26B, 27B, 28B, 29B, 30B, 31B and 32B correspond to views taken on the single-dot chain line B-B' of FIG. 9A and illustrate cross sections of the semiconductor substrate 2 in the high-withstand voltage region 11A. FIGS. 10C, 11C, 12C, 13C, 14C, 15C, 16C, 17C, 18C, 19C, 20C, 21C, 22C, 23C, 24C, 25C, 26C, 27C, 28C, 29C, 30C, 31C and 32C correspond to views taken on the single-dot chain line C-C' of FIG. 9B and illustrate cross sections of the semiconductor substrate 2 in the high-withstand voltage region 11B. FIGS. 10D, 11D, 12D, 13D, 14D, 15D, 16D, 17D, 18D, 19D, 20D, 21D, 22D, 23D, 24D, 25D, 26D, 27D, 28D, 29D, 30D, 31D and 32D correspond to views taken on the single-dot chain line D-D' of FIG. 9C and illustrate cross sections of the semiconductor substrate 2 in the high-withstand voltage region 11B. FIGS. 10E, 11E, 12E, 13E, 14E, 15E, 16E, 17E, 18E, 19E, 20E, 21E, 22E, 23E, 24E, 25E, 26E, 27E, 28E, 29E, 30E, 31E and 32E correspond to views taken on the single-dot chain line E-E' of FIG. 9D and illustrate cross sections of the semiconductor substrate 2 in the SRAM region 12.

A description will be made of the steps illustrated in FIGS. 10A to 10E. After the semiconductor substrate 2 is prepared, a silicon dioxide ($SiO_2$) film (not illustrated) is formed on the semiconductor substrate 2, and a silicon nitride (SiN) film (not illustrated) is formed on the silicon dioxide film. The semiconductor substrate 2 is, for example, a P-type silicon (Si) substrate. The silicon dioxide film is formed by, for example, a thermal oxidation method, and the silicon nitride film is formed by, for example, a CVD (Chemical Vapor Deposition) method. Next, a resist pattern (not illustrated) a portion of which where the element-isolating insulating film 3 is formed is opened is formed on the silicon nitride film by photolithography. Then, dry etching is performed using the resist pattern as a mask to form a trench in the semiconductor substrate 2. Next, the remaining portions of the resist pattern are removed by, for example, ashing.

Subsequently, a silicon dioxide film is formed on the sidewalls of the trench of the semiconductor substrate 2 by a CVD method, and a silicon dioxide film is formed in the trench of the semiconductor substrate 2 by an HDPCVD (High Density Plasma CVD) method. Next, planarization is performed by CMP (Chemical Mechanical Polishing) to form the element-isolating insulating films 3 on the semiconductor substrate 2. Consequently, a plurality of active regions 4 defined by the element-isolating insulating films 3 is formed on a surface of the semiconductor substrate 2. Here, an example is cited in which the element-isolating insulating films 3 are formed on the semiconductor substrate 2 by an STI method. Alternatively, the element-isolating insulating films 3 may be formed on the semiconductor substrate 2 by, for example, a LOCOS (Local Oxidation of Silicon) method. Next, after the silicon nitride film is removed, sacrificial oxide films 61 are formed on the surface of the semiconductor substrate 2 by, for example, a thermal oxidation method or a CVD method. The sacrificial oxide film 61 is, for example, a silicon dioxide film.

A description will be made of the steps illustrated in FIGS. 11A to 11E. A P-type impurity is ion-implanted in the entire surface of the semiconductor substrate 2 without using a resist pattern-based mask to form DPWs 31 within the semiconductor substrate 2. That is, the DPWs 31 are formed within the semiconductor substrate 2 in the high-withstand voltage regions 11A to 11C and the SRAM region 12. The DPWs 31 are formed in a region ranging from a first depth of the semiconductor substrate 2 to a second depth thereof greater than the first depth. The DPWs 31 are formed under the condition that the ion implantation of, for example, boron (B+) is performed at an acceleration energy of 500 keV or higher but not higher than 2000 keV and a dose amount of $1.0E12/cm^2$ or larger but not larger than $2.0E13/cm^2$.

A description will be made of the steps illustrated in FIGS. 12A to 12E. The resist pattern 51 is formed on the semiconductor substrate 2 by photolithography. A P-type impurity is ion-implanted using the resist pattern 51 as a mask to form the HVPWs 21A to 21C within the semiconductor substrate 2. That is, the HVPW 21A is formed within the semiconductor substrate 2 in the high-withstand voltage region 11A, the HVPW 21B is formed within the semiconductor substrate 2 in the high-withstand voltage region 11B, and the HVPW 21C is formed within the semiconductor substrate 2 in the high-withstand voltage region 11C. In FIGS. 12A to 12E, the HVPW 21C is excluded from the illustrations. The HVPWs 21A to 21C are formed in a region ranging from the surface of the semiconductor substrate 2 to the third depth thereof.

The HVPWs 21A to 21C are formed by performing ion implantation under conditions (1) and (2), for example, described below.

Conditions (1)

Ionic species: Phosphorus (P+)

Acceleration energy: 250 keV or higher but not higher than 800 keV

Dose amount: $1.0E12/cm^2$ or larger but not larger than $2.0E13/cm^2$

Conditions (2)

Ionic species: Phosphorus (P+)

Acceleration energy: 15 keV or higher but not higher than 250 keV

Dose amount: $1.0E12/cm^2$ or larger but not larger than $1.0E13/cm^2 \times 4$

Ion implantation under conditions (2) is performed four times. Without limitation to this condition, however, the ion implantation under conditions (2) may be performed only once. By the ion implantation under conditions (2), punch-through stop layers are formed in the HVPWs 21A to 21C. Note that the ion implantation under conditions (2) may be omitted.

A description will be made of the steps illustrated in FIGS. 13A to 13E. After the resist pattern 51 is removed by ashing, the resist pattern 52 is formed on the semiconductor substrate 2 by photolithography. An N-type impurity is ion-implanted using the resist pattern 52 as a mask to annihilate the DPWs 31 formed within the semiconductor substrate 2, thereby forming the DNWs 32A to 32C within the semiconductor substrate 2 in the high-withstand voltage regions 11A to 11C. That is, the DNWs 32A to 32C are formed underneath the HVPWs 21A to 21C within the semiconductor substrate 2 in the high-withstand voltage regions 11A to 11C in positions overlapping with the DPWs 31 located underneath the HVPWs 21A to 21C in the high-withstand voltage regions 11A to 11C. In FIGS. 13A to 13E, the DNW 32C is excluded from the illustrations. The DNWs 32A to 32C are formed in a region ranging from the fifth depth of the semiconductor substrate 2 to the sixth depth thereof greater than the fifth depth. The DNWs 32A to 32C are formed under the condition that the ion implantation of, for example, phosphorus (P+) is performed at an acceleration energy of 1000 keV or higher but not higher than 2000 keV and a dose amount of $5.0E12/cm^2$ or larger but not larger than $5.0E13/cm^2$.

A description will be made of the steps illustrated in FIG. 14A to 14E. After the resist pattern 52 is removed by ashing, the resist pattern 53 is formed on the semiconductor substrate 2 by photolithography. An N-type impurity is ion-implanted using the resist pattern 53 as a mask to form the HVNWs 22A to 22C within the semiconductor substrate 2 in the high-withstand voltage regions 11A to 11C. In FIGS. 14A to 14E, the HVNWs 22A and 22C are excluded from the illustrations. The HVNWs 22A to 22C are formed under the condition that the ion implantation of, for example, phosphorus (P+) is performed at an acceleration energy of 200 keV or higher but not higher than 600 keV and a dose amount of $1.0E12/cm^2$ or larger but not larger than $1.0E13/cm^2$. This ion implantation is performed four times. Without limitation to this condition, however, the ion implantation may be performed only once.

A description will be made of the steps illustrated in FIGS. 15A to 15E. After the resist pattern 53 is removed by ashing, a resist pattern 62 is formed on the semiconductor substrate 2 by photolithography. An N-type impurity is ion-implanted using the resist pattern 62 as a mask to form a channel region 63 within the HVPW 21A in the high-withstand voltage region 11A.

A description will be made of the steps illustrated in FIGS. 16A to 16E. After the resist pattern 62 is removed by ashing, the sacrificial oxide films 61 are removed by wet etching using, for example, hydrofluoric acid (HF). Next, tunnel oxide films 64 are formed on the surface of the semiconductor substrate 2 by, for example, a thermal oxidation method or a CVD method. The tunnel oxide film 64 is one example of a first gate insulating film. Subsequently, an impurity-doped amorphous silicon (Doped Amorphous Silicon (DASI)) film 65 is formed on the semiconductor substrate by, for example, a CVD method.

A description will be made of the steps illustrated in FIGS. 17A to 17E. A resist pattern 66 is formed on the amorphous silicon film 65 by photolithography. Next, dry etching is performed using the resist pattern 66 as a mask to pattern the amorphous silicon film 65. As the result of the amorphous silicon film 65 being patterned, floating gates 67 are formed in the high-withstand voltage region 11A. The tunnel oxide films 64 and the amorphous silicon film 65 in the high-withstand voltage regions 11B and 11C and the SRAM region 12 are removed by dry etching.

A description will be made of the steps illustrated in FIGS. 18A to 18E. After the resist pattern 66 is removed by ashing, an ONO film 68 including a high temperature oxide (HTO) film, a silicon nitride film and a silicon dioxide film is formed on the semiconductor substrate 2. This ONO film 68 is also called an intermediate insulating film. The high-temperature oxide film is formed by, for example, a thermal CVD method. The silicon nitride film and the silicon dioxide film are formed by, for example, a CVD method.

A description will be made of the steps illustrated in FIGS. 19A to 19E. The resist pattern 54 is formed on the semiconductor substrate 2 by photolithography. A P-type impurity is ion-implanted using the resist pattern 54 as a mask to form the LVPW 41A within the semiconductor substrate 2 in the SRAM region 12. The LVPW 41B is formed within the semiconductor substrate 2 between the high-withstand voltage region 11A and the high-withstand voltage region 11B, and the LVPW 41C is formed within the semiconductor substrate 2 between the high-withstand voltage region 11A and the SRAM region 12, though the LVPWs 41B and 41C are excluded from the illustrations in FIGS. 19A to 19E. The LVPWs 41A to 41C are formed under the condition that the ion implantation of, for example, boron (B+) is performed four times at an acceleration energy of 100 keV or higher but not higher than 300 keV and a dose amount of $2.0E12/cm^2$ or larger but not larger than $1.0E13/cm^2$. This ion implantation is performed four times. Without limitation to this condition, however, the ion implantation may be performed only once. Next, the resist pattern 54 is removed by ashing.

Subsequently, the resist pattern 55 is formed on the semiconductor substrate 2 by photolithography. A P-type impurity is ion-implanted using the resist pattern 55 as a mask to form the LVNW 42 within the semiconductor substrate 2 in the SRAM region 12. In FIGS. 19A to 19E, the resist pattern 55 and the LVNW 42 are excluded from the illustrations. The LVNW 42 is formed under the condition that the ion implantation of, for example, phosphorus (P+) is performed four times at an acceleration energy of 200 keV or higher but not higher than 700 keV and a dose amount of $2.0E12/cm^2$ or larger but not larger than $1.0E13/cm^2$. This ion implantation is performed four times. Without limitation to this condition, however, the ion implantation may be performed only once. Next, the resist pattern 55 is removed by ashing.

A description will be made of the steps illustrated in FIGS. 20A to 20E. A resist pattern 71 is formed on the semiconductor substrate 2 by photolithography. A P-type impurity is ion-implanted using the resist pattern 71 as a mask to form a channel region 72 within the LVPW 41A in the SRAM region 12. Next, the resist pattern 71 is removed by ashing. Subsequently, a resist pattern (not illustrated) is formed on the semiconductor substrate 2 by photolithography. Next, an N-type impurity is ion-implanted using the resist pattern as a mask to form a channel region (not illustrated) within the LVNW 42 in the SRAM region 12. Then, the resist pattern is removed by ashing.

A description will be made of the steps illustrated in FIGS. 21A to 21E. A resist pattern (not illustrated) in which the high-withstand voltage regions 11B and 11C and the SRAM region 12 are opened is formed on the semiconductor substrate 2 by photolithography. Next, dry etching is performed using the resist pattern as a mask to remove the ONO film 68 in the high-withstand voltage regions 11B and 11C and the SRAM region 12. Subsequently, gate oxide films 73 are formed on the surface of the semiconductor substrate 2 in the high-withstand voltage regions 11B and 11C and the SRAM region 12 by, for example, a thermal oxidation method or a CVD method. Next, a resist pattern (not illustrated) in which the SRAM region 12 is opened is formed on the semiconductor substrate 2, by photolithography. Subsequently, using the resist pattern as a mask, the gate oxide film 73 in the SRAM region 12 is removed by wet etching using, for example, hydrofluoric acid. Next, a gate oxide film 74 is formed on the surface of the semiconductor substrate 2 in the SRAM region 12 by, for example, a thermal oxidation method or a CVD method. The gate oxide film 73 differs in film thickness from the gate oxide film 74, i.e., the film thickness of the gate oxide film 74 is smaller than the film thickness of the gate oxide film 73. The gate oxide film 74 is one example of a second gate insulating film.

A description will be made of the steps illustrated in FIGS. 22A to 22E. Polysilicon 75 is formed on the semiconductor substrate 2 by, for example, a CVD method. Subsequently, an antireflection film 76 is formed on the polysilicon 75 by, for example, a CVD method. The antireflection film 76 is, for example, a nitride film.

A description will be made of the steps illustrated in FIGS. 23A to 23E. A resist pattern (not illustrated) is formed on the antireflection film 76 by photolithography. Dry etching is performed using the resist pattern as a mask to pattern the tunnel oxide films 64, the floating gates 67, the ONO film 68, the polysilicon 75 and the antireflection film 76. This patterning forms flash gates (stack gates) including the tunnel oxide films 64, the floating gates 67, the ONO films 68 and the control gates 77 in the high-withstand voltage region 11A.

A description will be made of the steps illustrated in FIGS. 24A to 24E. A sacrificial oxide film (not illustrated) is formed on the semiconductor substrate 2 by, for example, a CVD method. Next, an N-type impurity is ion-implanted to form LDD (Lightly Doped Drain) regions 78 within the HVPW 21A in the high-withstand voltage region 11A. Subsequently, after the sacrificial oxide film is removed, a silicon nitride film 79 is formed on the semiconductor substrate 2 by, for example, a CVD method.

A description will be made of the steps illustrated in FIGS. 25A to 25E. Etch-back is performed on the silicon nitride film 79 to form first sidewalls 81 on the side surfaces of the flash gate formed in the high-withstand voltage region 11A. The antireflection film 76 formed in the high-withstand voltage regions 11A to 11C and the silicon nitride film 79 formed in the high-withstand voltage regions 11B and 11C and the SRAM region 12 are removed as the result of etch-back being performed.

A description will be made of the steps illustrated in FIGS. 26A to 26E. A resist pattern 82A for covering the high-withstand voltage region 11A is formed on the semiconductor substrate 2 in the high-withstand voltage region 11A by photolithography, and a resist pattern 82B for gate formation is formed on the polysilicon 75.

A description will be made of the steps illustrated in FIGS. 27A to 27E. Dry etching is performed using the resist patterns 82A and 82B as masks to form the gate electrodes 83 in the high-withstand voltage regions 11B and 11C and the SRAM region 12. In FIGS. 27A to 27E, the gate electrode 83 formed in the high-withstand voltage region 11C is excluded from the illustrations. As is understood from FIGS. 27C to 27E and FIGS. 9B to 9D, the gate length of each gate electrode 83 formed in the high-withstand voltage region 11B is greater than the gate length of the gate electrode 83 formed in the SRAM region 12. In other words, the gate length of the gate electrode 83 formed in the SRAM region 12 is less than the gate length of each gate electrode 83 formed in the high-withstand voltage region 11B. The gate electrode 83 formed in the SRAM region 12 is one example of a first gate electrode. Each gate electrode 83 formed in the high-withstand voltage region 11B is one example of a second gate electrode.

A description will be made of the steps illustrated in FIGS. 28A to 28E. The remaining resist patterns 82A and 82B are removed by ashing. Resist patterns are formed, impurities are ion-implanted, and the resist patterns are removed as appropriate. N-type LDD regions 84A are formed within the HVPW 21B in the high-withstand voltage region 11B, and P-type LDD regions 84B are formed within the HVNW 22B in the high-withstand voltage region 11B. N-type LDD regions 84A are formed within the HVPW 21C in the high-withstand voltage region 11C, and P-type LDD regions 84B are formed within the HVNW 22B in the high-withstand voltage region 11C. In FIGS. 28A to 28E, the P-type LDD regions 84A and the N-type LDD regions 84B formed in the high-withstand voltage region 11C are excluded from the illustrations. N-type pocket regions 85 and N-type extension regions (not illustrated) are formed within the LVPW 41A in the SRAM region 12. P-type pocket regions (not illustrated) and P-type extension regions (not illustrated) are formed within the LVNW 42 in the SRAM region 12.

A description will be made of the steps illustrated in FIGS. 29A to 29E. After a silicon nitride film is formed on the semiconductor substrate 2 by, for example, a CVD method, etch-back is performed on the silicon nitride film to form second sidewalls 86 on the side surfaces of the first sidewalls 81 and the side surfaces of the gate electrodes 83.

A description will be made of the steps illustrated in FIGS. 30A to 30 E. Resist patterns are formed, impurities are ion-implanted, and the resist patterns are removed as appropriate. Source-drain regions 87 are formed within the HVPW 21A in the high-withstand voltage region 11A. N-type source-drain regions 88A are formed within the HVPW 21B in the high-withstand voltage region 11B, and P-type source-drain regions 88B are formed within the HVNW 22B in the high-withstand voltage region 11B. N-type source-drain regions 88A are formed within the HVPW 21C in the high-withstand voltage region 11C, and P-type source-drain regions 88B are formed within the HVNW 22C in the high-withstand voltage region 11C. In FIGS. 30A to 30 E, the N-type source-drain regions 88A and the P-type source-drain regions 88B formed in the high-withstand voltage region 11C are excluded from the illustrations. N-type source-drain regions 89 are formed within the LVPW 41A in the SRAM region 12. P-type source-drain regions (not illustrated) are formed within the LVNW 42 in the SRAM region 12.

A description will be made of the steps illustrated in FIGS. 31A to 31E. A heat treatment is performed after a metal film made of titanium (Ti), cobalt (Co), nickel (Ni) or the like is formed on the semiconductor substrate 2. Consequently, metal silicides 91 are formed on the control gates 77, the gate electrodes 83, the source-drain regions 87, the N-type source-drain regions 88A and 89, and the P-type source-drain regions 88B. Next, an unreacted metal film is selectively removed by, for example, chemical solution treatment.

A description will be made of the steps illustrated in FIGS. 32A to 32E. A silicon dioxide film is deposited on the semiconductor substrate 2 by, for example, a CVD method to form an interlayer insulating film 92 on the semiconductor substrate 2. Next, a resist pattern (not illustrated) portions of which where contact plugs 5 are to be formed are opened is formed by photolithography. The interlayer insulating film 92 is dry-etched using the resist pattern as a mask to form contact holes in the interlayer insulating film 92. Subsequently, the resist pattern is removed by ashing. A titanium nitride (TiN) film, a tungsten (W) film, and the like are deposited in the contact holes of the interlayer insulating film 92 by, for example, a CVD method. A superfluous titanium nitride film, tungsten film and the like on the interlayer insulating film 92 are removed by CMP to form the contact plugs 5 within the interlayer insulating film 92. Next, desired back-end processes are carried out after wiring lines and the like are formed, and thus the semiconductor device 1 is manufactured.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions has been described in detail, it should be understood that the various changes, substitutions, and alterations could be made hereto without departing from the spirit and scope of the invention.

What is claimed is:

1. A semiconductor device manufacturing method comprising:
   performing ion implantation of a first conductivity type to form a first well of the first conductivity type from a first depth of a substrate to a second depth greater than the first depth in the substrate;
   performing ion implantation of the first conductivity type on a first region of the substrate to form a second well of the first conductivity type at a third depth from a surface of the substrate in the first region of the substrate;
   performing ion implantation of a second conductivity type different from the first conductivity type on the first region of the substrate to form a third well of the second conductivity type underneath the second well in the first region of the substrate in a position overlapping with the first well located underneath the second well in the first region of the substrate;
   performing ion implantation of the second conductivity type on the first region of the substrate to form a fourth well, that surrounds the second well in a plan view and has the second conductivity type, at a fourth depth from the surface of the substrate in the first region of the substrate;
   performing ion implantation of the first conductivity type on a second region of the substrate to form a fifth well of the first conductivity type above the first well in the second region of the substrate; and
   performing ion implantation of the second conductivity type on the second region of the substrate to form a sixth well of the second conductivity type above the first well in the second region of the substrate,
   wherein:
   the substrate includes a third region;
   in the forming the third well, a seventh well of the second conductivity type is formed from a fifth depth of the substrate to a sixth depth greater than the fifth depth in the third region of the substrate by performing ion implantation of the second conductivity type;
   the seventh well is located in a position overlapping with the first well in the third region of the substrate; and
   in forming the fourth well, an eighth well of the second conductivity type is formed above the seventh well in the third region of the substrate by performing ion implantation of the second conductivity type in the third region of the substrate.

2. The semiconductor device manufacturing method according to claim 1, wherein:
   an outer edge of the third well is positioned outside the outer edge of the second well in a plan view; and
   a bottom of the fourth well is positioned deeper than the bottom of the second well.

3. The semiconductor device manufacturing method according to claim 1, further comprising:
   forming a first gate insulating film on the substrate in the first region, a floating gate on the first gate insulating film, an intermediate insulating film on the floating gate, and a control gate on the intermediate insulating film; and
   forming a second gate insulating film on the substrate in the second region, and a first gate electrode on the second gate insulating film.

4. The semiconductor device manufacturing method according to claim 1, further comprising: forming a first gate insulating film on the substrate in the first region, a floating gate on the first gate insulating film, an intermediate insulating film on the floating gate, and a control gate on the intermediate insulating film; forming a second gate insulating film on the substrate in the second region, and a first gate electrode on the second gate insulating film; and forming a third gate insulating film on the substrate in the third region, and a second gate electrode shorter in gate length than the first gate electrode on the third gate insulating film.

5. The semiconductor device manufacturing method according to claim 1, wherein the first conductivity type is a P type and the second conductivity type is an N type.

6. The semiconductor device manufacturing method according to claim 1, wherein: in forming the second well, a ninth well of the first conductivity type is formed at the third depth from the surface of the substrate in the third region of the substrate by ion implantation of the first conductivity type on the third region of the substrate, within the substrate; the eighth well surrounds the ninth well in a plan view; and the seventh well is located underneath the eighth well and the ninth well.

7. A semiconductor device comprising:
a substrate that includes a first region and a second region;
a first well of a first conductivity type formed from a first depth to a second depth greater than the first depth of the substrate in the first region and the second region;
a second well of the first conductivity type formed at a third depth from a surface of the substrate in the first region;
a third well, that overlaps with the first well in the first region, of a second conductivity type different from the first conductivity type formed in the first region of the substrate and located underneath the second well;
a fourth well, that surrounds the second well in a plan view, of the second conductivity type formed at a fourth depth from the surface of the substrate in the first region;
a fifth well of the first conductivity type formed in the second region of the substrate and located above the first well in the second region; and
a sixth well of the second conductivity type formed in the second region of the substrate and located above the first well in the second region,
wherein the first well is formed in the third region of the substrate, the semiconductor device further comprising:
a seventh well of the second conductivity type formed from a fifth depth to a sixth depth greater than the fifth depth of the substrate in the third region;
the seventh well overlaps with the first well in the third region; and
an eighth well of the second conductivity type formed above the seventh well in the third region of the substrate.

8. The semiconductor device according to claim 7, wherein:
an outer edge of the third well is positioned outside the outer edge of the second well in a plan view; and
a bottom of the fourth well is positioned deeper than the bottom of the second well.

9. The semiconductor device according to claim 7, further comprising:
a first gate insulating film on the substrate in the first region;
a floating gate on the first gate insulating film;
an intermediate insulating film on the floating gate;
a control gate on the intermediate insulating film;
a second gate insulating film on the substrate in the second region; and
a first gate electrode on the second gate insulating film.

10. The semiconductor device according to claim 7, further comprising; a first gate insulating film on the substrate in the first region; a floating gate on the first gate insulating film; an intermediate insulating film on the floating gate; a control gate on the intermediate insulating film; a second gate insulating film on the substrate in the second region; a first gate electrode on the second gate insulating film; a third gate insulating film on the substrate in the third region; and a second gate electrode shorter in gate length than the first gate electrode on the third gate insulating film.

11. The semiconductor device according to claim 7, wherein the first conductivity type is a P type and the second conductivity type is an N type.

* * * * *